(12) United States Patent
Sakano et al.

(10) Patent No.: US 10,778,216 B2
(45) Date of Patent: Sep. 15, 2020

(54) CONTROL CIRCUIT, SEMICONDUCTOR DEVICE, AND ELECTRICAL CIRCUIT DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Tatsunori Sakano, Shinagawa (JP); Kazuto Takao, Tsukuba (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/565,705

(22) Filed: Sep. 10, 2019

(65) Prior Publication Data
US 2020/0220540 A1    Jul. 9, 2020

(30) Foreign Application Priority Data
Jan. 4, 2019    (JP) .................................. 2019-000103

(51) Int. Cl.
*H03K 17/567* (2006.01)
*H01L 29/739* (2006.01)
(Continued)

(52) U.S. Cl.
CPC ....... *H03K 17/567* (2013.01); *H01L 27/0727* (2013.01); *H01L 29/7395* (2013.01);
(Continued)

(58) Field of Classification Search
CPC .............. H03K 17/567; H01L 27/0727; H01L 29/7395
(Continued)

(56) References Cited

U.S. PATENT DOCUMENTS 9,831,865 B2 * 11/2017 Lokrantz ................ H03K 17/18
2016/0035867 A1    2/2016 Pfirsch et al.
2018/0308757 A1 * 10/2018 Kakimoto ............... H01L 29/78

FOREIGN PATENT DOCUMENTS

JP      2015-226142 A    12/2015
JP      2016-92163 A      5/2016
(Continued)

*Primary Examiner* — Tomi Skibinski
(74) *Attorney, Agent, or Firm* — Oblon, McClelland, Maier & Neustadt, L.L.P.

(57) ABSTRACT

According to one embodiment, a control circuit is connected to an element portion including a first element. The first element is an RC-IGBT. The first element includes a first gate, a first other gate, a first collector, and a first emitter. The control circuit performs a first operation and a second operation. In at least a portion of the first operation, the control circuit causes a first current to flow from the first collector toward the first emitter. In at least a portion of the second operation, the control circuit causes a second current to flow from the first emitter toward the first collector. In the second operation, the control circuit supplies a first pulse to the first gate and supplies a first other pulse to the first other gate. The first pulse has a first start time and a first end time.

19 Claims, 14 Drawing Sheets

(51) Int. Cl.
  *H01L 27/07*   (2006.01)
  *H02M 1/00*    (2006.01)
  *H02P 27/08*       (2006.01)
  *H02M 7/5387*      (2007.01)

(52) U.S. Cl.
  CPC .......... *H02M 1/00* (2013.01); *H02M 7/53871* (2013.01); *H02M 2001/0054* (2013.01); *H02P 27/08* (2013.01)

(58) Field of Classification Search
  USPC ................................................ 327/108–112
  See application file for complete search history.

(56) References Cited

FOREIGN PATENT DOCUMENTS

| | | |
|---|---|---|
| JP | 2016-522661 A | 7/2016 |
| JP | 6080023 B2 | 2/2017 |
| JP | 2017-135255 A | 8/2017 |
| WO | WO 2015/182038 A1 | 12/2015 |
| WO | WO 2016/072074 A1 | 5/2016 |

\* cited by examiner

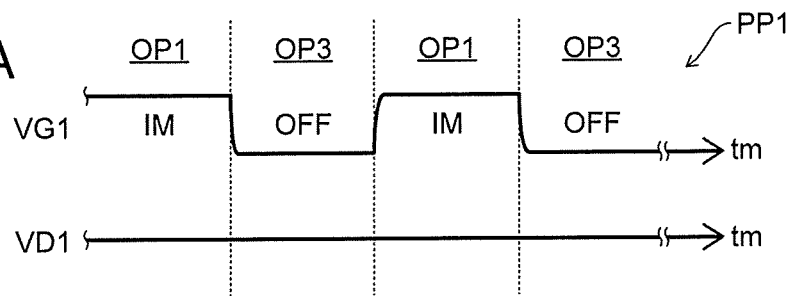
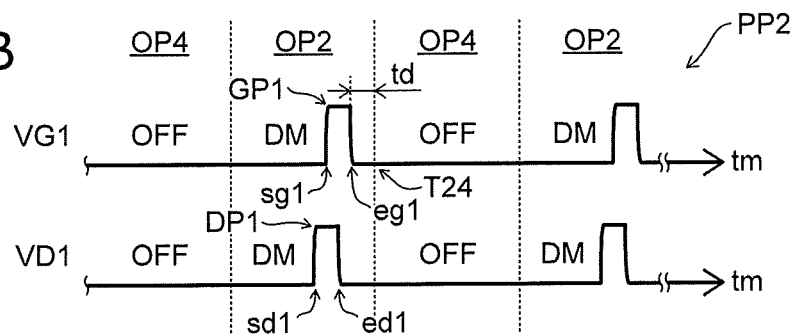
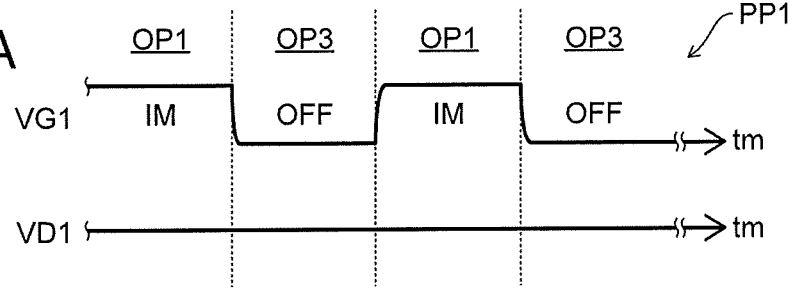
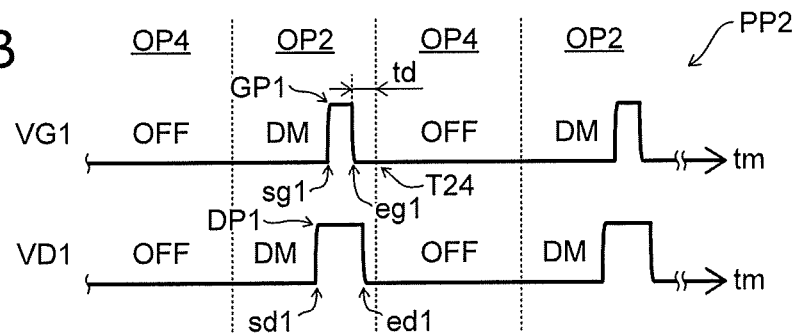

CONTROL CIRCUIT, SEMICONDUCTOR DEVICE, AND ELECTRICAL CIRCUIT DEVICE

CROSS-REFERENCE TO RELATED APPLICATIONS

This application is based upon and claims the benefit of priority from Japanese Patent Application No. 2019-000103, filed on Jan. 4, 2019; the entire contents of which are incorporated herein by reference.

FIELD

Embodiments described herein relate generally to a control circuit, a semiconductor device, and an electrical circuit device.

BACKGROUND

For example, a semiconductor device such as an IGBT (insulated gate bipolar transistor) or the like is used in a power conversion circuit, etc. A control circuit and an electrical circuit that can suppress the loss of the semiconductor device are desirable.

BRIEF DESCRIPTION OF THE DRAWINGS

FIG. 3A and FIG. 3B are schematic views illustrating the operation of the control circuit, the semiconductor device, and the electrical circuit device according to the first embodiment;

FIG. 4A and FIG. 4B are schematic views illustrating the operation of the control circuit, the semiconductor device, and the electrical circuit device according to the first embodiment;

DETAILED DESCRIPTION

Figure 1A:
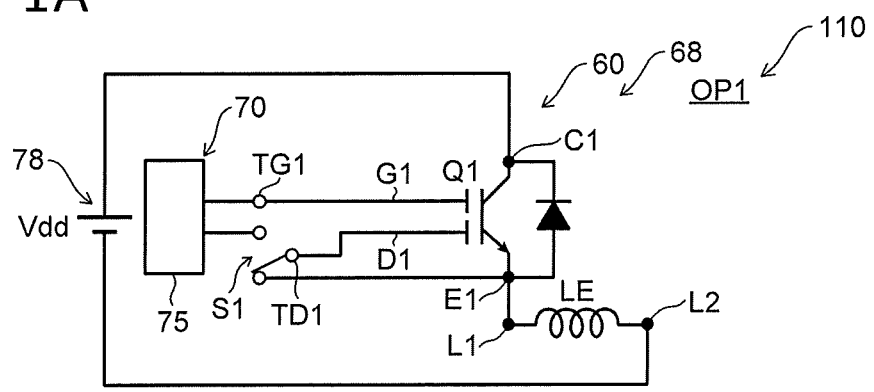
FIG. 1A and FIG. 1B are schematic views illustrating a control circuit, a semiconductor device, and an electrical circuit device according to a first embodiment.

According to one embodiment, a control circuit is connected to an element portion including a first element. The first element is an RC-IGBT. The first element includes a first gate, a first other gate, a first collector, and a first emitter. The control circuit is configured to perform a first operation and a second operation. In at least a portion of the first operation, the control circuit is configured to cause a first current to flow from the first collector toward the first emitter. In at least a portion of the second operation, the control circuit is configured to cause a second current to flow from the first emitter toward the first collector. In the second operation, the control circuit is configured to supply a first pulse to the first gate and supplies a first other pulse to the first other gate. The first pulse has a first start time and a first end time. The first other pulse has at least one of a first other start time or a first other end time. The first other start time is different from the first start time. The first other end time is different from the first end time.

According to one embodiment, a semiconductor device includes an element portion including a first element. The first element includes a first gate, a first other gate, a first collector, a first emitter, a semiconductor portion, a first insulating region, a second insulating region, a first gate terminal electrically connected to the first gate, and a first other gate terminal electrically connected to the first other gate and independent of the first gate terminal. The semiconductor portion includes a first semiconductor region provided between the first collector and the first emitter in a first direction, a second semiconductor region provided between the first semiconductor region and the first emitter and electrically connected to the first emitter, a third semiconductor region provided between the first semiconductor region and the second semiconductor region in the first direction, and a fourth semiconductor region provided between the first semiconductor region and the first collector. The fourth semiconductor region includes a plurality of first partial regions and a plurality of second partial regions. The first direction is from the first collector toward the first emitter. The first semiconductor region is of a first conductivity type. The second semiconductor region is of the first conductivity type. The third semiconductor region is of a second conductivity type. The plurality of first partial regions is of the first conductivity type.

The plurality of second partial regions is of the second conductivity type. The plurality of first partial regions and the plurality of second partial regions are provided alternately in a direction crossing the first direction. A direction from the first gate toward a portion of the first semiconductor region and a direction from the first gate toward the third semiconductor region are aligned with a second direction crossing the first direction. A direction from the first other gate toward a portion of the first semiconductor region and a direction from the first other gate toward the third semiconductor region are aligned with the second direction. The first insulating region is provided between the first gate and the semiconductor portion and between the first gate and the first emitter. The second insulating region is provided between the first other gate and the semiconductor portion and between the first other gate and the first emitter.

According to another embodiment, an electrical circuit device includes the control circuit described above and a semiconductor device including the element portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
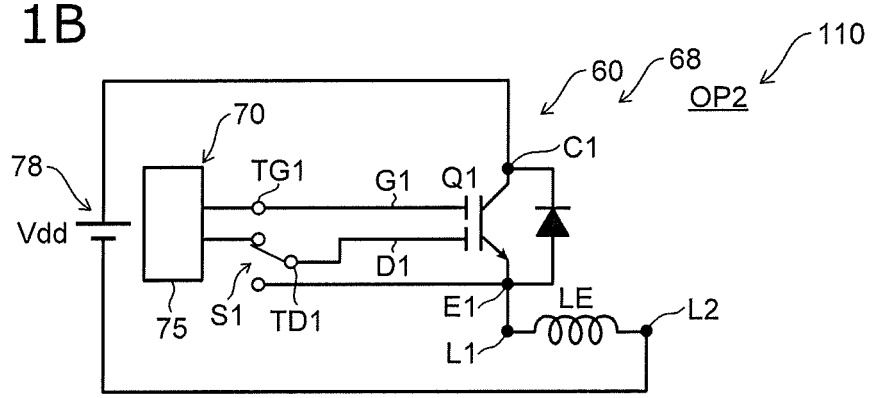

FIG. 1A and FIG. 1B are schematic views illustrating a control circuit, a semiconductor device, and an electrical circuit device according to a first embodiment.

The electrical circuit device 110 according to the embodiment includes the semiconductor device 68 and the control circuit 70. The electrical circuit device 110 may further include a power supply 78.

The semiconductor device 68 includes an element portion 60. The element portion 60 includes a first element Q1. For example, the power supply 78 supplies electrical power to the element portion 60.

The first element Q1 includes a first gate G1, a first other gate D1, a first collector C1, and a first emitter E1. The first element Q1 is, for example, an RC-IGBT (reverse-conducting insulated gate bipolar transistor). Examples of the structure of the first element Q1 are described below.

For example, a load LE is connected to the semiconductor device 68 of the electrical circuit device 110. For example, a first end portion L1 of the load LE is electrically connected to the first emitter E1. For example, the first collector C1 and a second end portion L2 of the load LE are connected to the power supply 78. For example, the power supply 78 applies a voltage Vdd between the second end portion L2 and the first collector C1.

For example, the first element Q1 includes a first gate terminal TG1 and a first other gate terminal TD1. The first gate terminal TG1 is electrically connected to the first gate G1. The first other gate terminal TD1 is electrically connected to the first other gate D1.

The control circuit 70 is connected to the element portion 60 (e.g., the first element Q1). For example, the control circuit 70 controls the potentials of the first gate G1 and the first other gate D1. The first element Q1 performs a switching operation thereby.

In the example, a controller 75 of the control circuit 70 is electrically connected to the first gate G1 via the first gate terminal TG1. On the other hand, a first switch S1 is provided in the example. The first switch S1 switches the connection between the first other gate terminal TD1 and the controller 75 of the control circuit 70.

The control circuit 70 performs a first operation OP1 and a second operation OP2. FIG. 1A corresponds to the first operation OP1. FIG. 1B corresponds to the second operation OP2.

For example, in the first operation OP1 as shown in FIG. 1A, the first other gate terminal TD1 (the first other gate D1) is electrically connected to the first emitter E1 by the operation of the first switch S1. For example, in the second operation OP2, the controller 75 of the control circuit 70 is electrically connected to the first other gate terminal TD1 (the first other gate D1) by the operation of the first switch S1. The first switch S1 may be included in the control circuit 70. The first switch S1 may be included in the element portion 60.

An example of the operation of the control circuit 70 will now be described. The operation of the control circuit 70 corresponds to the operation of the electrical circuit device 110. In the following example, a third operation OP3 and a fourth operation OP4 are performed in addition to the first operation OP1 and the second operation OP2.

FIG. 2A to FIG. 2D are schematic views illustrating the operation of the control circuit, the semiconductor device, and the electrical circuit device according to the first embodiment.

FIG. 2A to FIG. 2D correspond respectively to the first operation OP1, the third operation OP3, the fourth operation OP4, and the second operation OP2. The control circuit 70, the switches, etc., are not illustrated in these drawings.

Figure 2A:
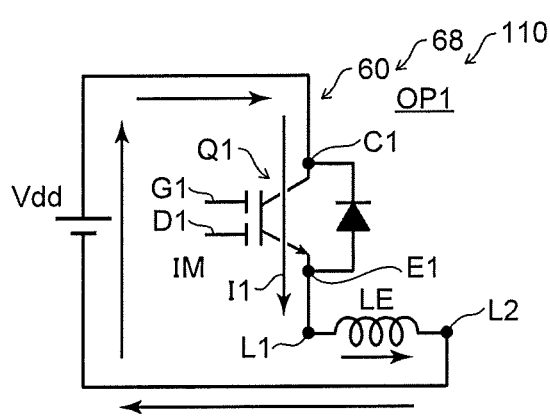
FIG. 2A to FIG. 2D are schematic views illustrating the operation of the control circuit, the semiconductor device, and the electrical circuit device according to the first embodiment.

In at least a portion of the first operation OP1 as shown in FIG. 2A, the control circuit 70 causes a first current I1 to flow from the first collector C1 toward the first emitter E1. The first current I1 flows from the first end portion L1 toward the second end portion L2 of the load LE.

Figure 2B:
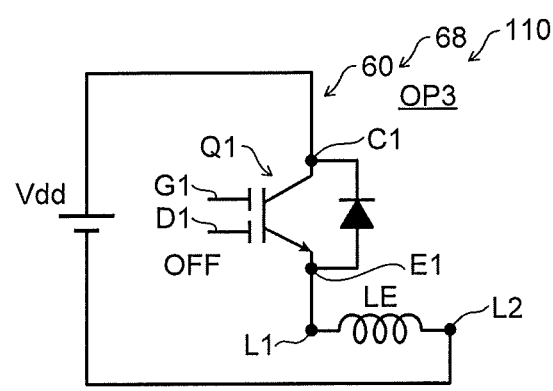
Figure 2C:
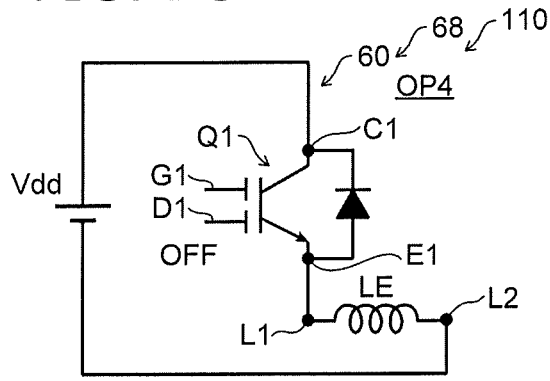
Figure 2D:
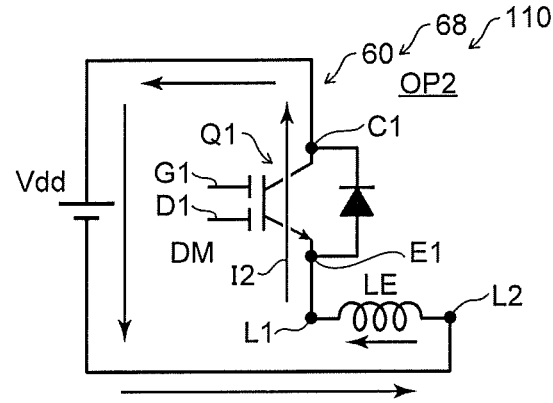

In at least a portion of the second operation OP2 as shown in FIG. 2D, the control circuit 70 causes a second current I2 to flow from the first emitter E1 toward the first collector C1. The second current I2 flows from the second end portion L2 toward the first end portion L1 of the load LE.

In the example as shown in FIG. 2B and FIG. 2C, the control circuit 70 sets the first element Q1 to the off-state in the third operation OP3 and the fourth operation OP4.

For example, the control circuit 70 may perform a first polar operation including the first operation OP1 and the third operation OP3, and a second polar operation including the fourth operation OP4 and the second operation OP2.

In the first operation OP1, the first element Q1 is in an IGBT mode IM. In the second operation OP2, for example, the first element Q1 is in a diode mode DM.

In the first operation OP1 of the embodiment, in the diode mode DM in which the second current I2 flows from the first emitter E1 toward the first collector C1, the potential of the first gate G1 and the potential of the first other gate D1 are controlled independently from each other.

FIG. 3A and FIG. 3B are schematic views illustrating the operation of the control circuit, the semiconductor device, and the electrical circuit device according to the first embodiment.

In these drawings, the horizontal axis corresponds to a time tm. In these drawings, the vertical axis is the voltage (a first gate voltage VG1) of the first gate G1 or the voltage (a first other gate voltage VD1) of the first other gate D1.

As shown in FIG. 3A, for example, the first operation OP1 and the third operation OP3 are repeatedly performed alternately in a first polar operation PP1. In the first operation OP1, the first element Q1 is in the IGBT mode IM. In the first operation OP1, the first gate voltage VG1 has a high voltage. In the third operation OP3, the first gate voltage VG1 has a low voltage. The low voltage is lower than the high voltage. The high voltage is, for example, +15 V. The low voltage is, for example, −15 V. In the third operation OP3, the first element Q1 is in the off-state.

On the other hand, in the first operation OP1 as described above, for example, the first other gate voltage VD1 is electrically connected to the first emitter E1. In the third operation OP3, for example, the first other gate voltage VD1 may be electrically connected to the first emitter E1. In the first operation OP1 and the third operation OP3, the first other gate voltage VD1 is, for example, the ground potential.

As shown in FIG. 3B, for example, the second operation OP2 and the fourth operation OP4 are repeatedly performed alternately in a second polar operation PP2. In the second operation OP2, the first element Q1 is in the diode mode DM. In the fourth operation OP4, the first element Q1 is in the off-state. In the off-state, the first gate voltage VG1 and the first other gate voltage VD1 are set to the low voltage (e.g., −15 V).

In the second operation OP2 of the diode mode DM, pulses (e.g., high voltages of +15 V or the like) are applied respectively to the first gate voltage VG1 and the first other gate voltage VD1. Thereby, for example, electrons are removed.

In the embodiment, in the second operation OP2 of the diode mode DM, independent pulses are supplied respectively to the first gate voltage VG1 and the first other gate voltage VD1. The heights of the pulses are, for example, the high voltage (e.g., +15 V). These pulses have mutually-independent start times and end times.

Thus, in the second operation OP2, the control circuit 70 supplies a first pulse GP1 to the first gate G1 and supplies a first other pulse DP1 to the first other gate D1. The first pulse GP1 has a first start time sg1 and a first end time eg1. The first other pulse DP1 has at least one of a first other start time sd1 that is different from the first start time sg1, or a first other end time ed1 that is different from the first end time eg1.

Thereby, as described below, a control circuit, a semiconductor device, and an electrical circuit device can be provided in which the loss can be suppressed.

A reference example may be considered in which the first other gate D1 is electrically connected to the first emitter E1 in both the first operation OP1 and the second operation OP2. In the first operation OP1, the first gate G1 operates as a gate; and the first other gate D1 does not operate as a gate. Therefore, a low gate capacitance can be maintained; as a result, a fast switching speed is obtained. In such a case, in the second operation OP2, the loss reduction amount is low because the number of channels is low.

In the reference example, the number of channels increases when the number of the first other gates D1 is increased; therefore, the loss reduction amount in the second operation OP2 can be increased. However, the gate capacitance increases; as a result, the switching speed decreases.

In the embodiment, in the first operation OP1, the first other gate D1 is electrically connected to the first emitter E1 and does not operate as a gate. Therefore, a low gate capacitance can be maintained. Then, in the second operation OP2, the number of channels is increased by applying gate pulses to the first gate G1 and the first other gate D1. The loss reduction amount can be increased thereby.

In the embodiment, the mutually-different independent pulses (the first pulse GP1 and the first other pulse DP1) are applied to the first gate G1 and the first other gate D1. Thereby, the loss can be reduced with a high efficiency matched to the element.

The period from the end time of the gate pulse (in the example of FIG. 3B, the first end time eg1) to a transition time T24 from the second operation OP2 to the fourth operation OP4 is taken as a dead period td. Generally, it is favorable for the dead period td to be short. The loss can be reduced more effectively thereby. For example, in the second operation OP2, if the same gate pulse is applied to both the first gate G1 and the first other gate D1 and the dead period td is excessively short, it is easy for shorts to occur; for example, breakdown of the element may occur.

For example, shorts are suppressed easily by applying the mutually-different independent pulses to the first gate G1 and the first other gate D1 and by setting the first other end time ed1 to be different from the first end time eg1. Breakdown of the element is suppressed easily.

For example, because the first other start time sd1 is different from the first start time sg1, the electrons start to be removed first from the gate having the fast switching speed (e.g., the first gate G1). Then, the electrons are removed additionally from the gate having the slow switching speed (e.g., the first other gate D1). By such an operation, the removal of the electrons is started faster; and the amount of the removed electrons increases. The loss can be reduced more efficiently thereby. According to the embodiment, a control circuit, a semiconductor device, and an electrical circuit device can be provided in which the loss can be suppressed.

In the example, the first other start time sd1 is before the first start time sg1. The first other end time ed1 is before the first end time eg1. As described below, these order relationships may be modified according to the characteristics of the first element Q1, the operating conditions, etc.

In the embodiment, a plurality of at least one of the first gate G1 or the first other gate D1 may be provided. The number of the first gates G1 may be different from the number of the first other gates D1.

For example, the number of the first gates G1 is smaller than the number of the first other gates D1. A fast switching speed is obtained thereby.

As described below, for example, the order relationship between the first other start time sd1 and the first start time sg1 and the order relationship between the first other end time ed1 and the first end time eg1 may be determined based on the difference between the number of the first gates G1 and the number of the first other gates D1.

FIG. 4A, FIG. 4B, FIG. 5A, FIG. 5B, FIG. 6A, and FIG. 6B are schematic views illustrating the operation of the control circuit, the semiconductor device, and the electrical circuit device according to the first embodiment.

In these drawings, the horizontal axis corresponds to the time tm. In these drawings, the vertical axis is the voltage (the first gate voltage VG1) of the first gate G1 or the voltage (the first other gate voltage VD1) of the first other gate D1. FIG. 4A to FIG. 6A correspond to the first operation OP1. FIG. 4B to FIG. 6B correspond to the second operation OP2.

In the example shown in FIG. 4B, the first other start time sd1 is before the first start time sg1; and the first other end time ed1 is after the first end time eg1. In such a case, the dead period td is determined by the first other end time ed1.

Figure 5A:
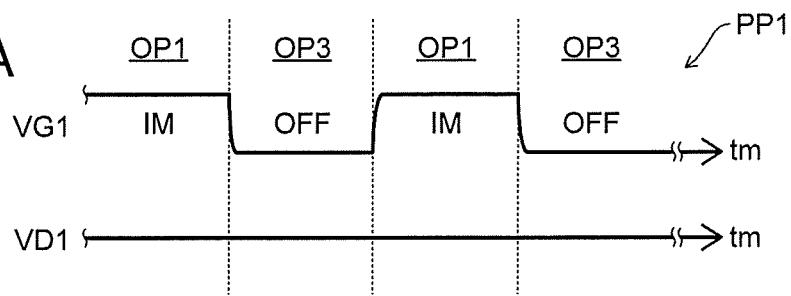
FIG. 5A and FIG. 5B are schematic views illustrating the operation of the control circuit, the semiconductor device, and the electrical circuit device according to the first embodiment.
Figure 5B:
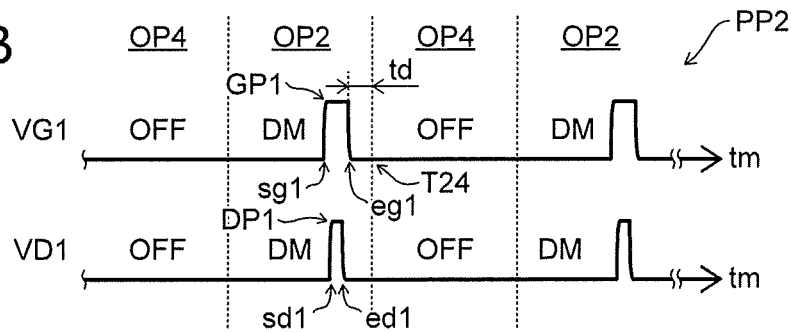

In the example shown in FIG. 5B, the first other start time sd1 is after the first start time sg1; and the first other end time ed1 is before the first end time eg1.

Figure 6A:
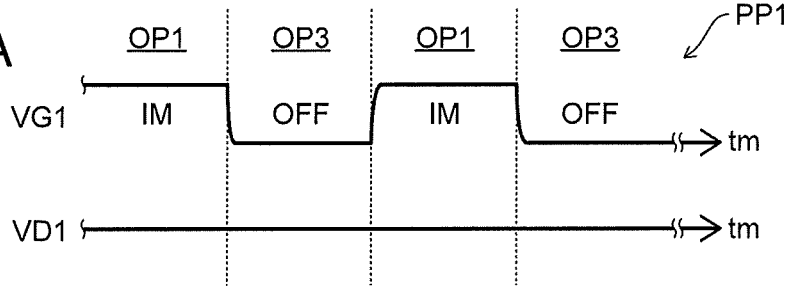
FIG. 6A and FIG. 6B are schematic views illustrating the operation of the control circuit, the semiconductor device, and the electrical circuit device according to the first embodiment.
Figure 6B:
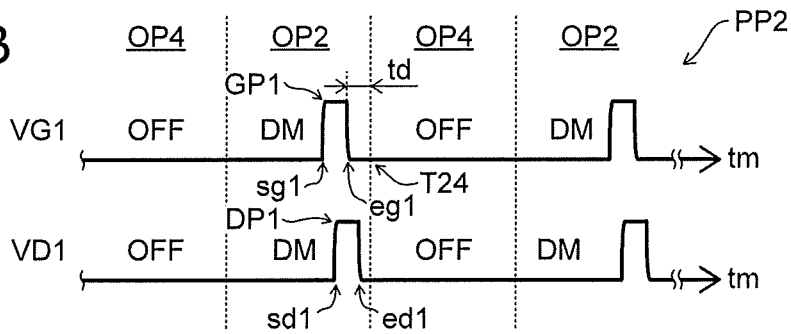

In the example shown in FIG. 6B, the first other start time sd1 is after the first start time sg1; and the first other end time ed1 is after the first end time eg1.

Figure 7:
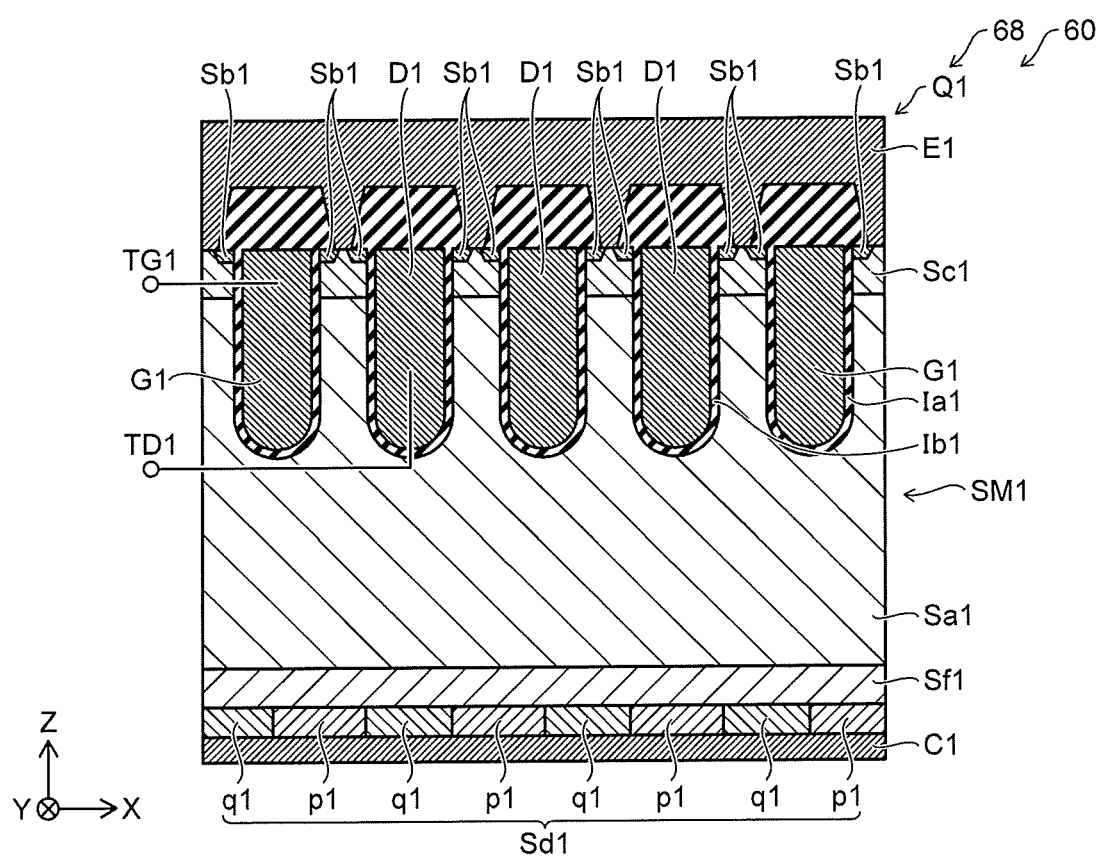
FIG. 7 is a schematic cross-sectional view illustrating the semiconductor device according to the first embodiment.

An example of the first element Q1 will now be described. FIG. 7 is a schematic cross-sectional view illustrating the semiconductor device according to the first embodiment.

As shown in FIG. 7, the semiconductor device 68 includes the element portion 60. The element portion 60 includes the first element Q1. The first element Q1 includes a semiconductor portion SM1, a first insulating region Ia1, and a second insulating region Ib1 in addition to the first gate G1, the first other gate D1, the first collector C1, and the first emitter E1. The first element Q1 may include the first gate terminal TG1 and the first other gate terminal TD1. As described above, the first gate terminal TG1 is electrically connected to the first gate G1. The first other gate terminal TD1 is electrically connected to the first other gate D1.

The semiconductor portion SM1 includes a first semiconductor region Sa1, a second semiconductor region Sb1, a third semiconductor region Sc1, and a fourth semiconductor region Sd1.

The first semiconductor region Sa1 is provided between the first collector C1 and the first emitter E1 in a first direction which is from the first collector C1 toward the first emitter E1. The first semiconductor region Sa1 is of a first conductivity type.

The first direction is taken as a Z-axis direction. One direction perpendicular to the Z-axis direction is taken as an X-axis direction. A direction perpendicular to the Z-axis direction and the X-axis direction is taken as a Y-axis direction.

The second semiconductor region Sb1 is electrically connected to the first emitter E1. The second semiconductor region Sb1 is of the first conductivity type.

The third semiconductor region Sc1 is provided between the first semiconductor region Sa1 and the second semiconductor region Sb1 in the first direction (the Z-axis direction). The third semiconductor region Sc1 is of a second conductivity type.

The first conductivity type is one of an n-type or a p-type. The second conductivity type is the other of the n-type or the p-type. Hereinbelow, the first conductivity type is taken to be the n-type; and the second conductivity type is taken to be the p-type.

The fourth semiconductor region Sd1 is provided between the first semiconductor region Sa1 and the first collector C1. The fourth semiconductor region Sd1 includes multiple first partial regions p1 of the first conductivity type and multiple second partial regions q1 of the second conductivity type. The multiple first partial regions p1 and the multiple second partial regions q1 are provided alternately in a direction crossing the first direction. The direction that crosses the first direction is, for example, the X-axis direction. The direction that crosses the first direction may be any direction along the X-Y plane.

A portion of the first semiconductor region Sa1 is between the first gate G1 and the fourth semiconductor region Sd1 in the first direction (the Z-axis direction). The direction from the first gate G1 toward the third semiconductor region Sc1 is aligned with a second direction (e.g., the X-axis direction) crossing the first direction. The direction from the bottom portion of the first gate G1 toward a portion of the first semiconductor region Sa1 is aligned with the second direction (e.g., the X-axis direction). Another portion of the first semiconductor region Sa1 is between the first other gate D1 and the fourth semiconductor region Sd1 in the first direction (the Z-axis direction). The direction from the first other gate D1 toward the third semiconductor region Sc1 is aligned with the second direction (e.g., the X-axis direction).

The first insulating region Ia1 is provided between the first gate G1 and the semiconductor portion SM1 and between the first gate G1 and the first emitter E1. The first insulating region Ia1 insulates the first gate G1 and the semiconductor portion SM1 from each other. The first insulating region Ia1 insulates the first gate G1 and the first emitter E1 from each other.

The second insulating region Ib1 is provided between the first other gate D1 and the semiconductor portion SM1 and between the first other gate D1 and the first emitter E1. The second insulating region Ib1 insulates the first other gate D1 and the semiconductor portion SM1 from each other. The second insulating region Ib1 insulates the first other gate D1 and the first emitter E1 from each other.

A RC-IGBT is obtained from such a structure.

In the example, the semiconductor portion SM1 further includes a semiconductor region Sf1.

The semiconductor region Sf1 is provided between the fourth semiconductor region Sd1 and the first semiconductor region Sa1 in the first direction (the Z-axis direction). The semiconductor region Sf1 is of the first conductivity type (e.g., the n-type).

In one example, the impurity concentration of the second conductivity type in the multiple second partial regions q1 is higher than the impurity concentration of the second conductivity type in the third semiconductor region Sc1. The multiple second partial regions q1 are, for example, $p^+$-layers; and the third semiconductor region Sc1 is a p-layer.

In one example, the impurity concentration of the first conductivity type in the semiconductor region Sf1 is between the impurity concentration of the first conductivity type in the first partial regions p1 and the impurity concentration of the first conductivity type in the first semiconductor region Sa1. For example, the first semiconductor region Sa1 is an n-layer. The second semiconductor region Sb1 is an $n^+$-layer. The first partial regions p1 are, for example, $n^+$-layers. The semiconductor region Sf1 is an n-layer.

The first semiconductor region Sa1 is, for example, a drift region. The second semiconductor region Sb1 is, for example, a source contact region. The third semiconductor region Sc1 is, for example, a body region. The semiconductor region Sf1 is a field stop region.

Second Embodiment

FIG. 8A to FIG. 8D are schematic views illustrating a control circuit, a semiconductor device, and an electrical circuit device according to a second embodiment.

The electrical circuit device 120 according to the embodiment includes the semiconductor device 68 and the control circuit 70. The electrical circuit device 120 may further include the power supply 78. These drawings correspond to the first to fourth operations OP1 to OP4 performed by the control circuit 70. In the example as shown in these drawings, the element portion 60 that is included in the semiconductor device 68 further includes a second element Q2 in addition to the first element Q1. The second element Q2 is, for example, an RC-IGBT.

In these drawings, a portion of the electrical connection between the first element Q1 and the controller 75 of the control circuit 70 and a portion of the electrical connection between the second element Q2 and the controller 75 of the control circuit 70 are not illustrated for easier viewing of the drawings.

The second element Q2 includes a second gate G2, a second other gate D2, a second collector C2, and a second emitter E2. The first emitter E1 of the first element Q1 is electrically connected to the second collector C2. The first emitter E1 is electrically connected to the second collector C2 and the first end portion L1 of the load LE. The voltage Vdd is applied between the first collector C1 and the second end portion L2 of the load. A voltage Vss is applied between the second end portion L2 and the second emitter E2. For example, the voltage Vdd and the voltage Vss are supplied by the power supply 78.

Figure 8A:
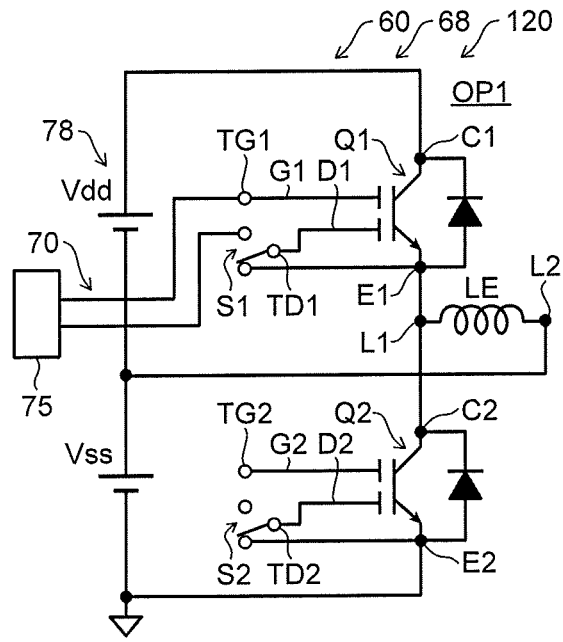
FIG. 8A to FIG. 8D are schematic views illustrating a control circuit, a semiconductor device, and an electrical circuit device according to a second embodiment.
Figure 8B:
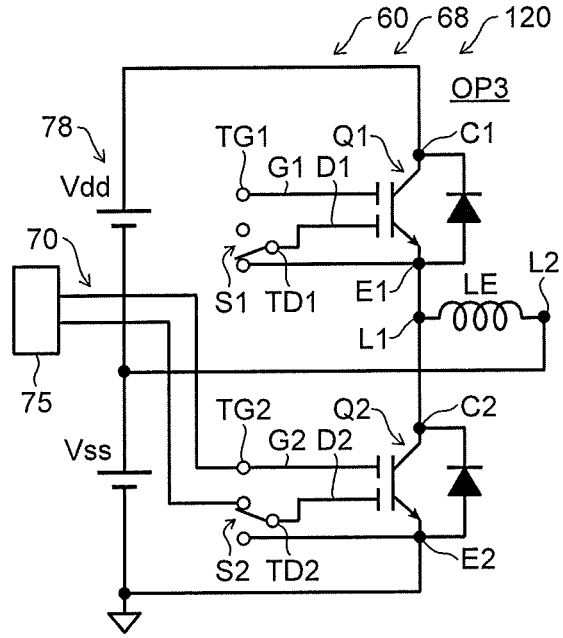

As described above, in the first operation OP1 as shown in FIG. 8A, the first other gate D1 is electrically connected to the first emitter E1 by the first switch S1. In the second operation OP2 as shown in FIG. 8D, the first other gate D1 is electrically connected to the controller 75 of the control circuit 70 by the first switch S1.

A second switch S2 may be provided. The second other gate D2 has the state of being electrically connected to the second emitter E2 by the second switch S2 (referring to FIG. 8C), and the state of being electrically connected to the control circuit 70 (the controller 75) (referring to FIG. 8B). The second switch S2 may be included in the control circuit 70. The second switch S2 may be included in the element portion 60.

As described above, in the third operation OP3 and the fourth operation OP4, the first element Q1 is in the off-state. In the example, in the third operation OP3 and the fourth operation OP4 as shown in FIG. 8B and FIG. 8C, the first other gate D1 may be electrically connected to the first emitter E1.

Figure 8C:
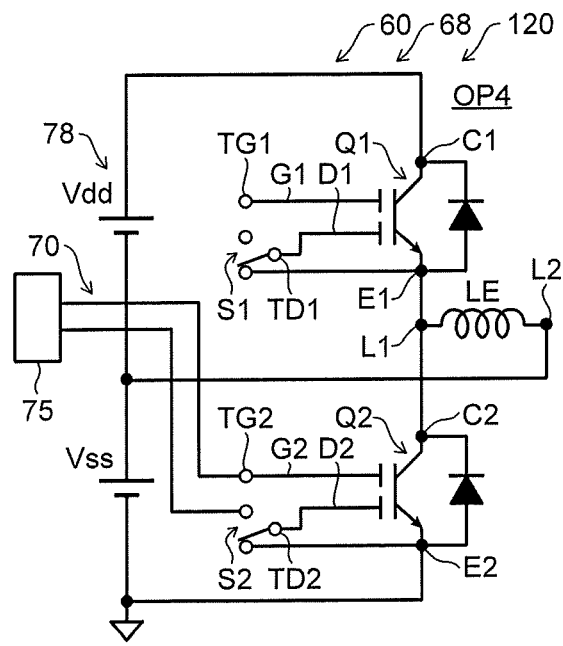
Figure 8D:
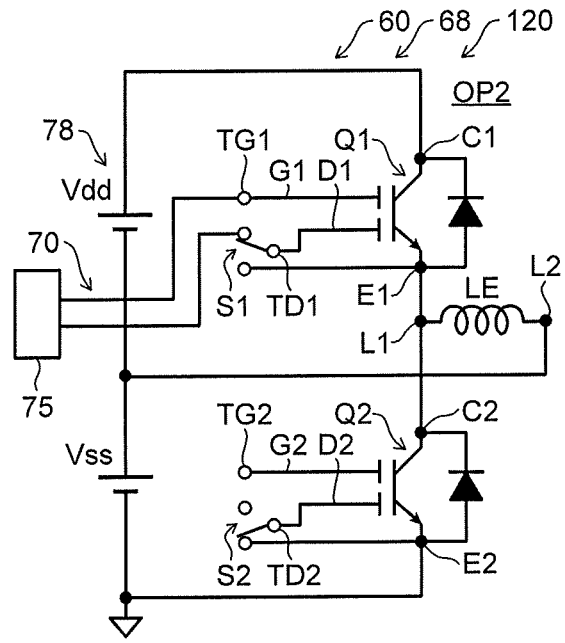

On the other hand, in the fourth operation OP4 as shown in FIG. 8C, the second other gate D2 of the second element Q2 is electrically connected to the second emitter E2 by the second switch S2. Thus, in the fourth operation OP4, the control circuit 70 electrically connects the second other gate D2 to the second emitter E2.

In the third operation OP3 as shown in FIG. 8B, the second other gate D2 of the second element Q2 is electrically connected to the controller 75 by the second switch S2.

In the first operation OP1 and the second operation OP2, the second element Q2 is in the off-state. In the example, in the first operation OP1 and the second operation OP2 as shown in FIG. 8A and FIG. 8D, the second other gate D2 is electrically connected to the second emitter E2.

FIG. 9A to FIG. 9D are schematic views illustrating the control circuit, the semiconductor device, and the electrical circuit device according to the second embodiment.

Figure 9A:
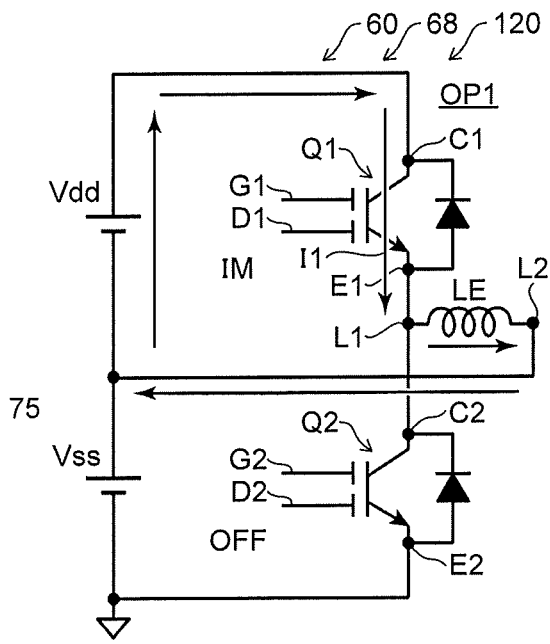
FIG. 9A to FIG. 9D are schematic views illustrating the control circuit, the semiconductor device, and the electrical circuit device according to the second embodiment.

In the first operation OP1 as shown in FIG. 9A, the first element Q1 is in the IGBT mode IM. The second element Q2 is in the off-state. In at least a portion of the first operation OP1, the control circuit 70 causes the first current I1 to flow from the first collector C1 toward the first emitter E1. The first current I1 flows from the first end portion L1 toward the second end portion L2 of the load LE.

Figure 9B:
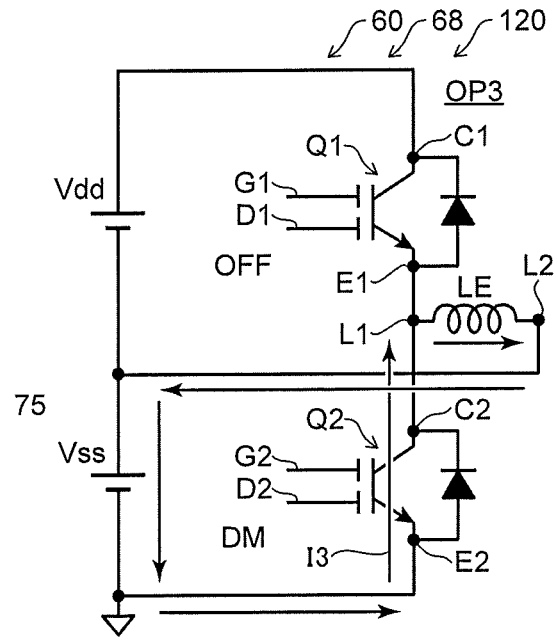
Figure 9C:
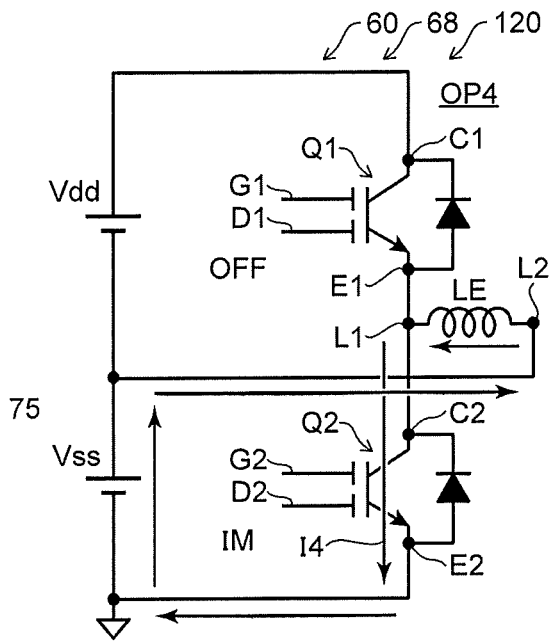
Figure 9D:
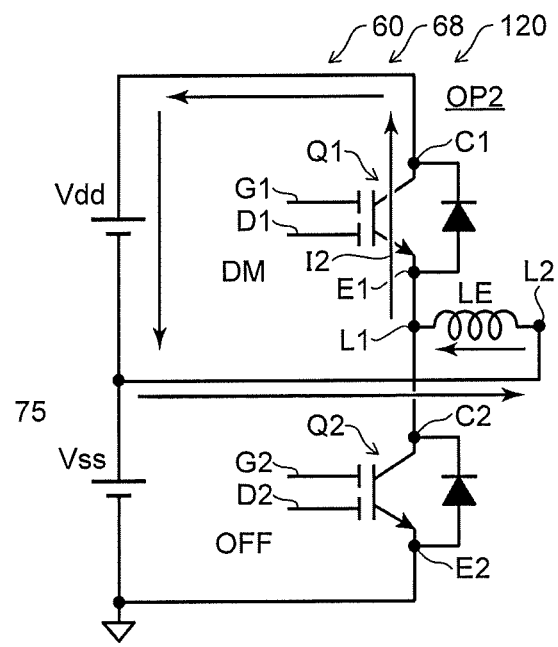

In the second operation OP2 as shown in FIG. 9D, the first element Q1 is in the diode mode DM. The second element Q2 is in the off-state. In at least a portion of the second operation OP2, the control circuit 70 causes the second current I2 to flow from the first emitter E1 toward the first collector C1. The second current I2 flows from the second end portion L2 toward the first end portion L1 of the load LE.

In the third operation OP3 as shown in FIG. 9B, the second element Q2 is in the diode mode DM. The first element Q1 is in the off-state. In at least a portion of the third operation OP3, the control circuit 70 causes a third current I3 to flow from the second emitter E2 toward the second collector C2. The third current I3 flows from the first end portion L1 toward the second end portion L2 of the load LE.

In the fourth operation OP4 as shown in FIG. 9C, the second element Q2 is in the IGBT mode IM. The first element Q1 is in the off-state. In at least a portion of the fourth operation OP4, the control circuit 70 causes a fourth current I4 to flow from the second collector C2 toward the second emitter E2. The fourth current I4 flows from the second end portion L2 toward the first end portion L1 of the load LE.

As recited below, in the third operation OP3 in which the second element Q2 is in the diode mode DM, the control circuit 70 applies independent pulses to the second gate G2 and the second other gate D2 of the second element Q2.

Figure 10A:
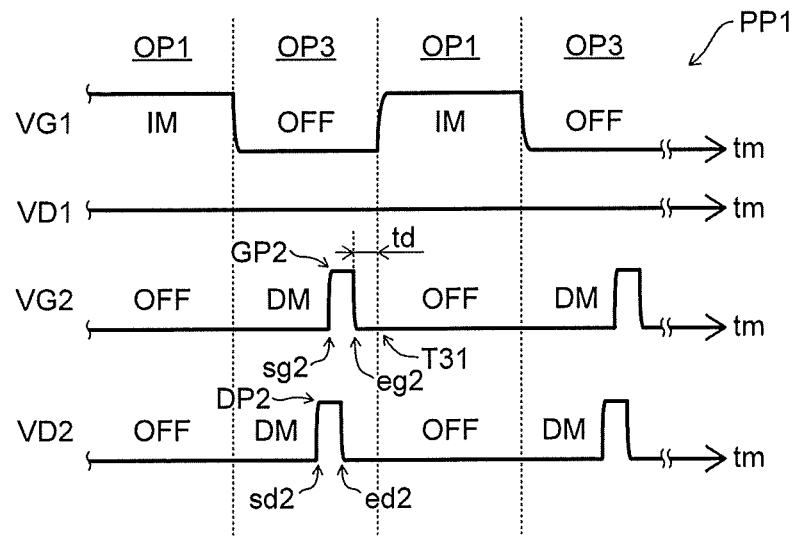
FIG. 10A and FIG. 10B are schematic views illustrating the operation of the control circuit, the semiconductor device, and the electrical circuit device according to the second embodiment.
Figure 10B:
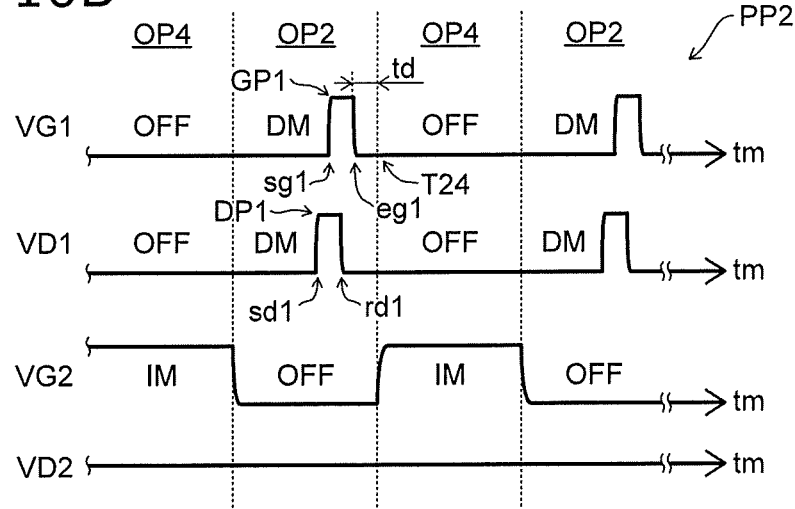

FIG. 10A and FIG. 10B are schematic views illustrating the operation of the control circuit, the semiconductor device, and the electrical circuit device according to the second embodiment.

In these drawings, the horizontal axis corresponds to the time tm. In these drawings, the vertical axis is the voltage (the first gate voltage VG1) of the first gate G1, the voltage (the first other gate voltage VD1) of the first other gate D1, the voltage (a second gate voltage VG2) of the second gate G2, or the voltage (a second other gate voltage VD2) of the second other gate D2.

As shown in FIG. 10A, for example, the first operation OP1 and the third operation OP3 are repeatedly performed alternately in the first polar operation PP1. In the first operation OP1, the first element Q1 is in the IGBT mode IM. In the third operation OP3, the first element Q1 is in the off-state. As described above, in the first operation OP1 and the third operation OP3, for example, the first other gate voltage VD1 is electrically connected to the first emitter E1.

In the first operation OP1 as shown in FIG. 10A, the second element Q2 is in the off-state. In the third operation OP3, the second element Q2 is in the diode mode DM. In the third operation OP3, the control circuit 70 supplies a second pulse GP2 to the second gate G2 and supplies a second other pulse DP2 to the second other gate D2.

The second pulse GP2 has a second start time sg2 and a second end time eg2. The second other pulse DP2 has at least one of a second other start time sd2 that is different from the second start time sg2, or a second other end time ed2 that is different from the second end time eg2.

For example, the second other start time sd2 is before the second start time sg2. The second other start time sd2 may be after the second start time sg2. For example, the second other end time ed2 is before the second end time eg2. The second other end time ed2 may be after the second end time eg2.

For example, shorts can be suppressed by reducing the dead period td from the end time of the gate pulse (in the example of FIG. 10A, the second end time eg2) to a transition time T31 from the third operation OP3 to the first operation OP1. The amount of the removed electrons also can be increased. The loss can be reduced more efficiently thereby.

On the other hand, as shown in FIG. 10B, for example, the second operation OP2 and the fourth operation OP4 are repeatedly performed alternately in the second polar operation PP2. In the fourth operation OP4, the second element Q2 is in the IGBT mode. In the second operation OP2, the second element Q2 is in the off-state. In the fourth operation OP4 and the second operation OP2, for example, the second other gate voltage VD2 is electrically connected to the second emitter E2. In the second operation OP2 as shown in FIG. 10B, the first element Q1 is in the diode mode DM. In the fourth operation OP4, the first element Q1 is in the off-state. In the embodiment as described above, in the second operation OP2 in which the first element Q1 is in the diode mode DM, independent pulses are supplied respectively to the first gate voltage VG1 and the first other gate voltage VD1.

Thus, in the diode mode DM, the control circuit 70 independently controls the gate pulses applied respectively to the first gate G1 and the first other gate D1. Also, in the diode mode DM, the control circuit 70 independently controls the gate pulses applied respectively to the second gate G2 and the second other gate D2. Thereby, the high switching speed can be maintained; and the loss can be suppressed more effectively while suppressing the element breakdown.

An example of the second element Q2 will now be described.

Figure 11:
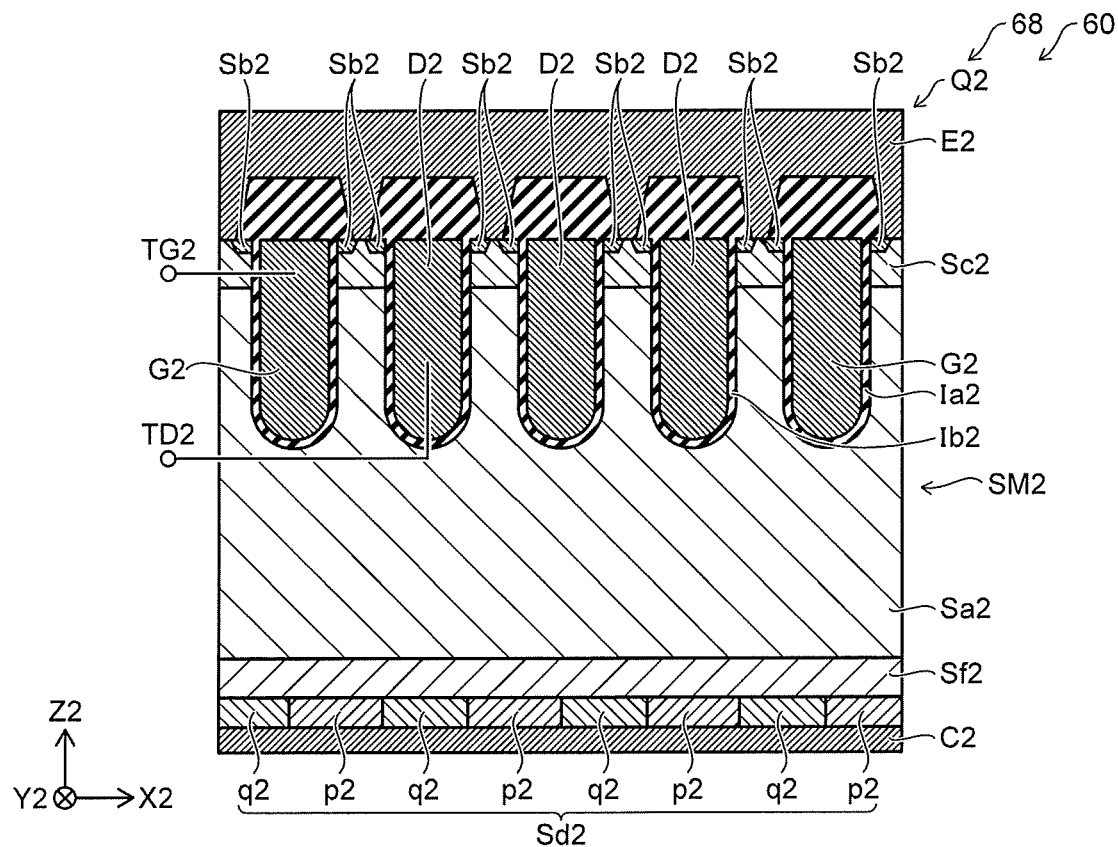
FIG. 11 is a schematic cross-sectional view illustrating the semiconductor device according to the second embodiment.

FIG. 11 is a schematic cross-sectional view illustrating the semiconductor device according to the second embodiment.

FIG. 11 illustrates the second element Q2. As shown in FIG. 11, the second element Q2 includes a semiconductor portion SM2, a first insulating region Ia2, and a second insulating region Ib2 in addition to the second gate G2, the second other gate D2, the second collector C2, and the second emitter E2. The second element Q2 may include a second gate terminal TG2 and a second other gate terminal TD2. The second gate terminal TG2 is electrically connected to the second gate G2. The second other gate terminal TD2 is electrically connected to the second other gate D2.

The semiconductor portion SM2 of the second element Q2 includes, for example, first to fourth semiconductor regions Sa2 to Sd2. In the example, the semiconductor portion SM2 further includes a semiconductor region Sf2.

The first semiconductor region Sa2 of the second element Q2 is of the first conductivity type and is provided between the second collector C2 and the second emitter E2 in a first direction of the second element Q2 which is from the second collector C2 toward the second emitter E2. The first direction is, for example, a Z2-axis direction of the second element Q2. One direction perpendicular to the Z2-axis direction is taken as an X2-axis direction. A direction perpendicular to the Z2-axis direction and the X2-axis direction is taken as a Y2-axis direction.

The second semiconductor region Sb2 of the second element Q2 is electrically connected to the second emitter E2 and is of the first conductivity type.

The third semiconductor region Sc2 of the second element Q2 is of the second conductivity type and is provided between the first semiconductor region Sa2 of the second element Q2 and the second semiconductor region Sb2 of the second element Q2 in the first direction of the second element Q2.

The fourth semiconductor region Sd2 of the second element Q2 is provided between the second collector C2 and the first semiconductor region Sa2 of the second element Q2. The fourth semiconductor region Sd2 of the second element Q2 includes multiple first partial regions p2 of the second element Q2 that are of the first conductivity type, and multiple second partial regions q2 of the second element Q2 that are of the second conductivity type. The multiple first partial regions p2 of the second element Q2 and the multiple second partial regions q2 of the second element Q2 are provided alternately in a direction crossing the first direction of the second element Q2. The direction that crosses the first direction of the second element Q2 is, for example, the X2-axis direction of the second element Q2.

A portion of the first semiconductor region Sa2 of the second element Q2 is between the second gate G2 and the fourth semiconductor region Sd2 of the second element Q2 in the first direction of the second element Q2.

The direction from the second gate G2 toward the third semiconductor region Sc2 of the second element Q2 is aligned with the second direction (e.g., the X2-axis direction) crossing the first direction of the second element Q2.

Another portion of the first semiconductor region Sa1 of the second element Q2 is between the second other gate D2 of the second element Q2 and the fourth semiconductor region Sd2 of the second element Q2 in the first direction of the second element Q2.

The direction from the second other gate D2 of the second element Q2 toward the third semiconductor region Sc2 of the second element Q2 is aligned with the second direction (e.g., the X2-axis direction) of the second element Q2.

The first insulating region Ia2 of the second element Q2 is provided between the second gate G2 and the semiconductor portion SM2 of the second element Q2 and between the second gate G2 and the second emitter E2.

The second insulating region Ib2 of the second element Q2 are provided between the second other gate D2 of the second element Q2 and the semiconductor portion SM2 of the second element Q2 and between the second emitter E2 and the second other gate D2 of the second element Q2.

The semiconductor region Sf2 of the second element Q2 is provided between the fourth semiconductor region Sd2 of the second element Q2 and the first semiconductor region Sa2 of the second element Q2 in the first direction of the second element Q2. The semiconductor region Sf2 of the second element Q2 is of the first conductivity type.

For example, the second element Q2 which is an RC-IGBT is obtained from such a configuration. The configuration of the second element Q2 may be substantially the same as the configuration of the first element Q1.

Figure 12:
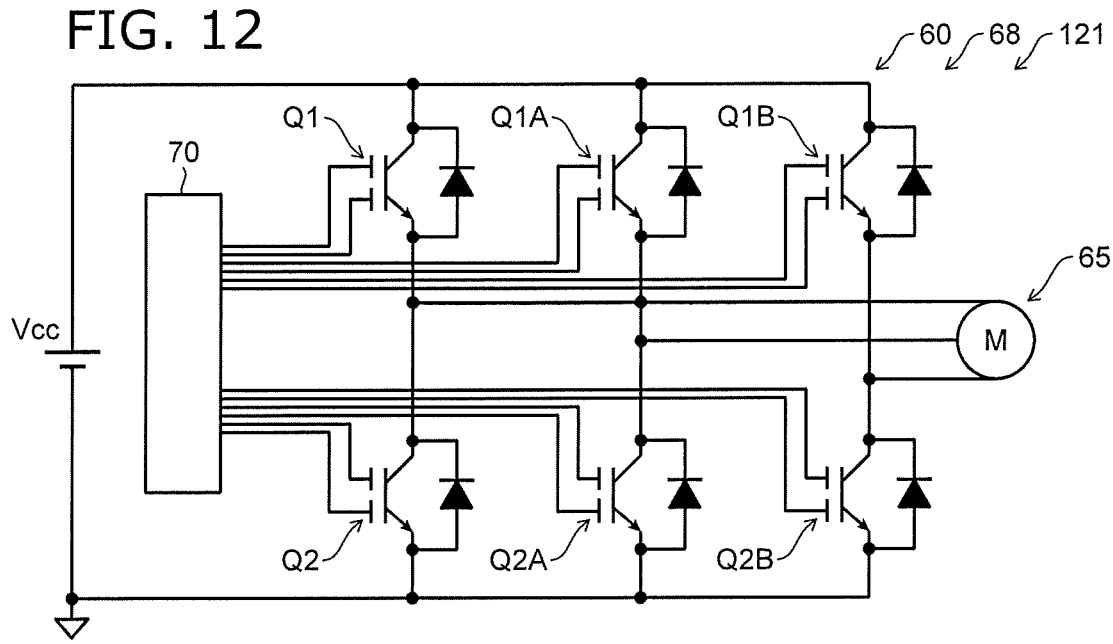
FIG. 12 is a schematic view illustrating the control circuit, the semiconductor device, and the electrical circuit device according to the second embodiment.

FIG. 12 is a schematic view illustrating the control circuit, the semiconductor device, and the electrical circuit device according to the second embodiment.

In the electrical circuit device 121 as shown in FIG. 12, the element portion 60 that is included in the semiconductor device 68 includes multiple sets including the first element Q1 and the second element Q2. For example, one set includes the first element Q1 and the second element Q2. Another set includes a first element Q1A and a second element Q2A. Yet another set includes a first element Q1B and a second element Q2B. The first element Q1A and the second element Q2A have configurations similar to those of the first element Q1 and the second element Q2. The first element Q1B and the second element Q2B have configurations similar to those of the first element Q1 and the second element Q2. For example, these sets are connected to a three-phase motor 65 or the like.

For example, the operation described in reference to FIG. 8A to FIG. 8D, FIG. 9A to FIG. 9D, FIG. 10A, and FIG. 10B is applied to each of the three sets. The operation recited above is performed for the three sets with the phases shifted 120 degrees. The loss can be suppressed in the electrical circuit device 121 (the control circuit 70 and the semiconductor device 68).

Third Embodiment

FIG. 13A to FIG. 13D are schematic views illustrating a control circuit, a semiconductor device, and an electrical circuit device according to a third embodiment.

The electrical circuit device 130 according to the embodiment includes the semiconductor device 68 and the control circuit 70. The electrical circuit device 130 may further include the power supply 78. These drawings correspond to the first to fourth operations OP1 to OP4 performed by the control circuit 70. In the example as shown in these drawings, the element portion 60 that is included in the semiconductor device 68 includes the first to fourth elements Q1 to Q4. The first to fourth elements Q1 to Q4 are, for example, RC-IGBTs. The first element Q1 and the second element Q2 may have the configurations described above. The third element Q3 and the fourth element Q4 may have configurations similar to those of the first element Q1 and the second element Q2.

In these drawings, a portion of the electrical connection between the controller 75 and the first element Q1, a portion of the electrical connection between the controller 75 and the second element Q2, a portion of the electrical connection between the controller 75 and the third element Q3, and a portion of the electrical connection between the controller 75 and the fourth element Q4 are not illustrated for easier viewing of the drawings.

The third element Q3 includes a third gate G3, a third other gate D3, a third collector C3, and a third emitter E3. The fourth element Q4 includes a fourth gate G4, a fourth other gate D4, a fourth collector C4, and a fourth emitter E4.

The first emitter E1 of the first element Q1 is electrically connected to the second collector C2. The first collector C1 is electrically connected to the third collector C3. The first emitter E1 is also electrically connected to the first end portion L1 of the load LE. The third emitter E3 is electrically connected to the fourth collector C4 and the second end portion L2 of the load LE. The second emitter E2 is electrically connected to the fourth emitter E4.

For example, a voltage Vcc is applied between the first collector C1 and the second emitter E2. For example, the voltage Vcc is supplied from the power supply 78.

A third switch S3 may be provided. Due to the third switch S3, the third other gate D3 has the state of being electrically connected to the third emitter E3 (referring to FIG. 13C) or the state of being electrically connected to the control circuit 70 (the controller 75) (referring to FIG. 13B). The third switch S3 may be included in the control circuit 70. The third switch S3 may be included in the element portion 60.

A fourth switch S4 may be provided. Due to the fourth switch S4, the fourth other gate D4 has the state of being electrically connected to the fourth emitter E4 (referring to FIG. 13A) or the state of being electrically connected to the control circuit 70 (the controller 75) (referring to FIG. 13D). The fourth switch S4 may be included in the control circuit 70. The fourth switch S4 may be included in the element portion 60.

Figure 13A:
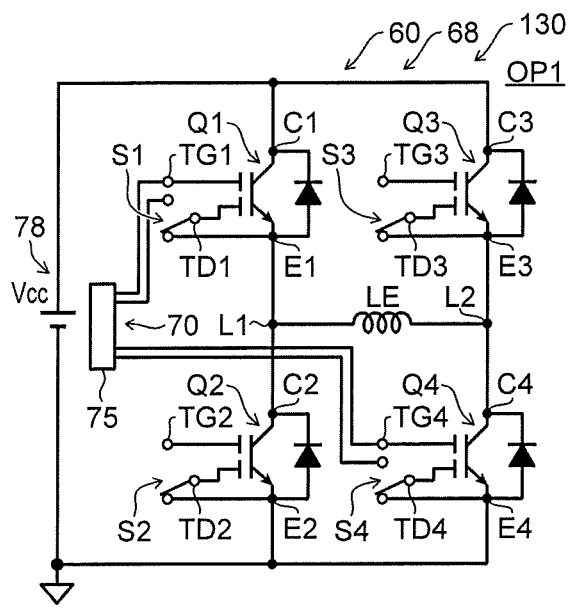
FIG. 13A to FIG. 13D are schematic views illustrating a control circuit, a semiconductor device, and an electrical circuit device according to a third embodiment.
Figure 13B:
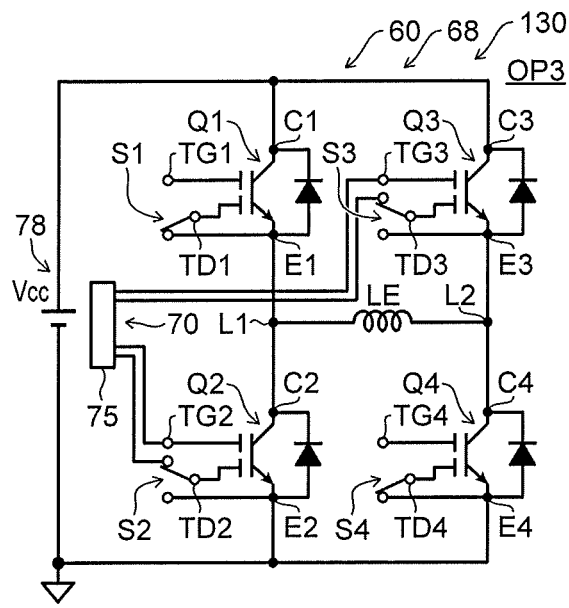
Figure 13C:
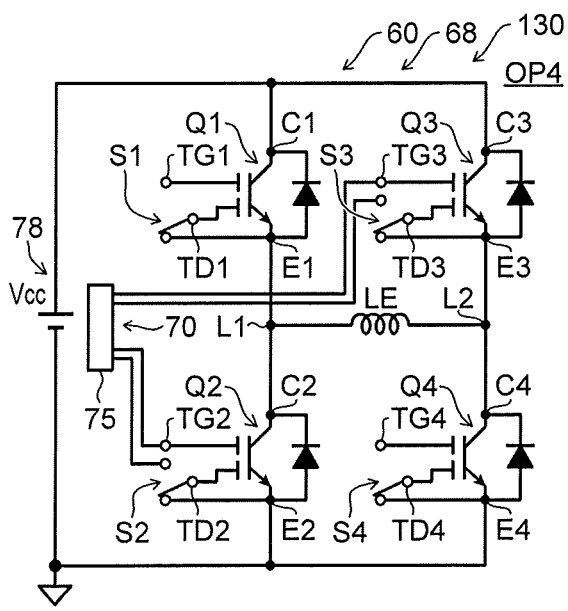
Figure 13D:
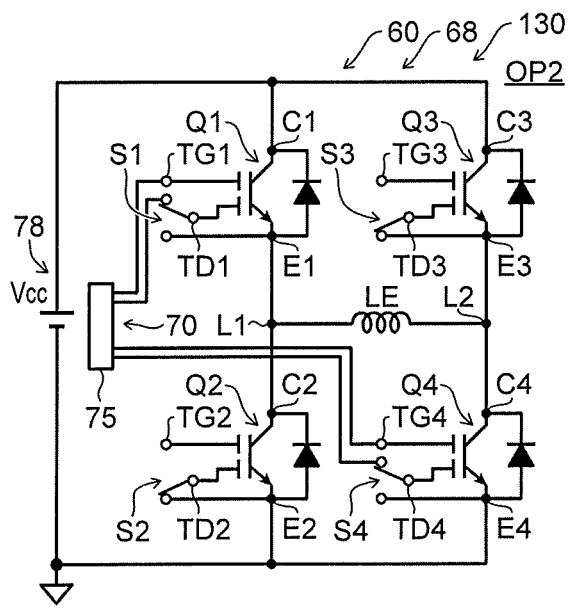

In the first operation OP1 as shown in FIG. 13A, the control circuit 70 electrically connects the first other gate D1 to the first emitter E1 and electrically connects the fourth other gate D4 to the fourth emitter E4. In the fourth operation OP4 as shown in FIG. 13C, the control circuit 70 electrically connects the second other gate D2 to the second emitter E2 and electrically connects the third other gate D3 to the third emitter E3.

FIG. 14A to FIG. 14D are schematic views illustrating the control circuit, the semiconductor device, and the electrical circuit device according to the third embodiment.

FIG. 14A to FIG. 14D correspond respectively to the first to fourth operations OP1 to OP4. The control circuit 70, the switches, etc., are not illustrated in these drawings.

Figure 14A:
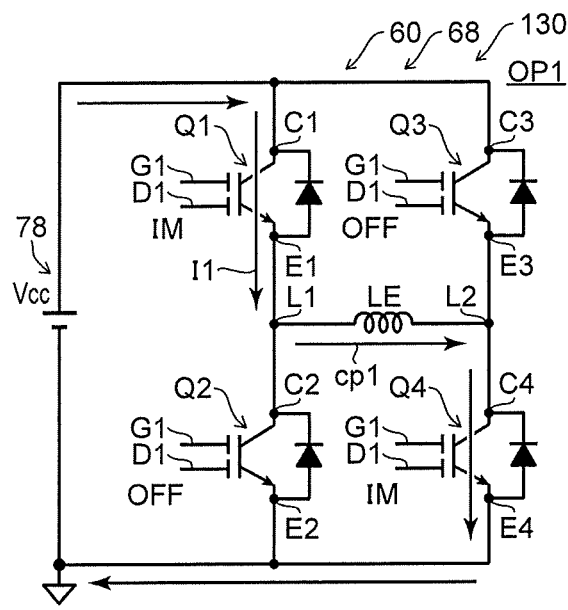
FIG. 14A to FIG. 14D are schematic views illustrating the control circuit, the semiconductor device, and the electrical circuit device according to the third embodiment.

In the first operation OP1 as shown in FIG. 14A, the control circuit 70 causes the first current I1 to flow in a first path cp1 from the first collector C1 toward the first emitter E1, from the first end portion L1 toward the second end portion L2, and from the fourth collector C4 toward the fourth emitter E4. In the first operation OP1, the control circuit 70 sets the second element Q2 and the third element Q3 to the off-state.

Figure 14B:
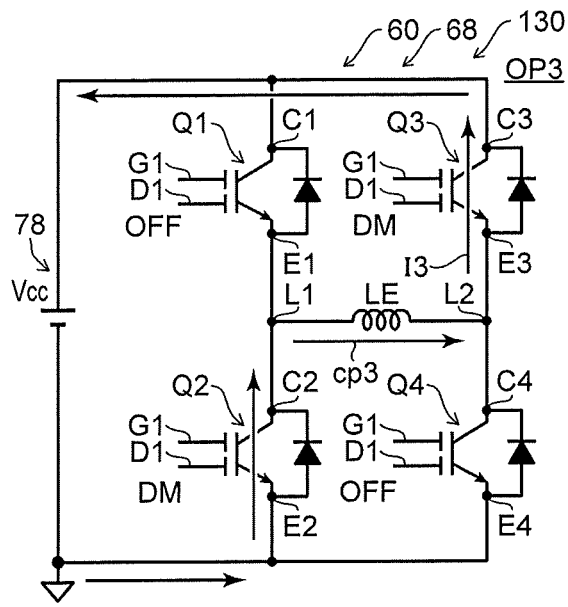
Figure 14C:
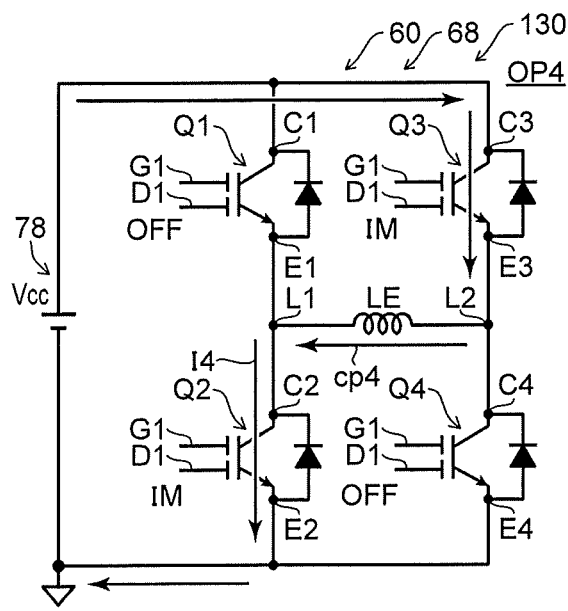
Figure 14D:
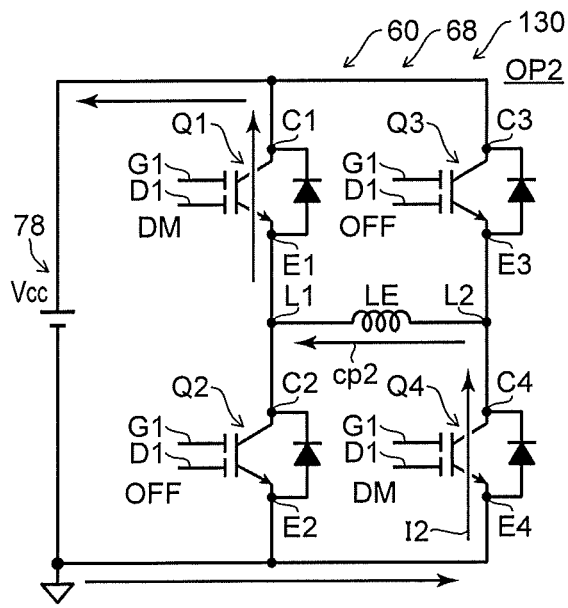

In the second operation OP2 as shown in FIG. 14D, the control circuit 70 causes the second current I2 to flow in a second path cp2 from the fourth emitter E4 toward the fourth collector C4, from the second end portion L2 toward the first end portion L1, and from the first emitter E1 toward the first collector C1. In the second operation OP2, the control circuit 70 sets the second element Q2 and the third element Q3 to the off-state.

In the third operation OP3 as shown in FIG. 14B, the control circuit 70 causes the third current I3 to flow in a third path cp3 from the second emitter E2 toward the second collector C2, from the first end portion L1 toward the second end portion L2, and from the third emitter E3 toward the third collector C3. In the third operation OP3, the control circuit 70 sets the first element Q1 and the fourth element Q4 to the off-state.

In the fourth operation OP4 as shown in FIG. 14C, the control circuit 70 causes the fourth current I4 to flow in a fourth path cp4 from the third collector C3 toward the third emitter E3, from the second end portion L2 toward the first end portion L1, and from the second collector C2 toward the second emitter E2. In the fourth operation OP4, the control circuit 70 sets the first element Q1 and the fourth element Q4 to the off-state.

In the embodiment as described below, independent pulses are applied to the gates and the other gates in the diode mode DM of such an operation.

Figure 15A:
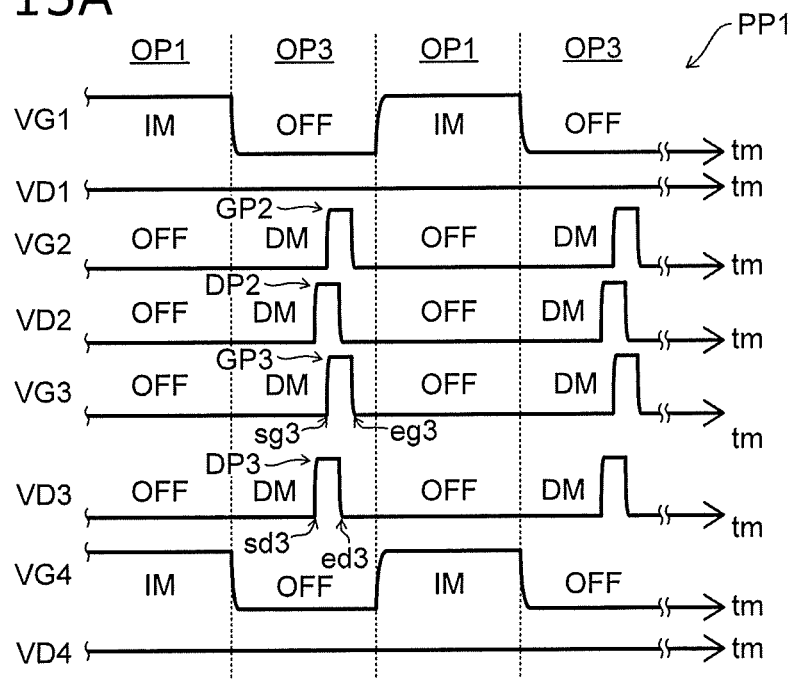
FIG. 15A to FIG. 15C are schematic views illustrating the operation of the control circuit, the semiconductor device, and the electrical circuit device according to the third embodiment.
Figure 15B:
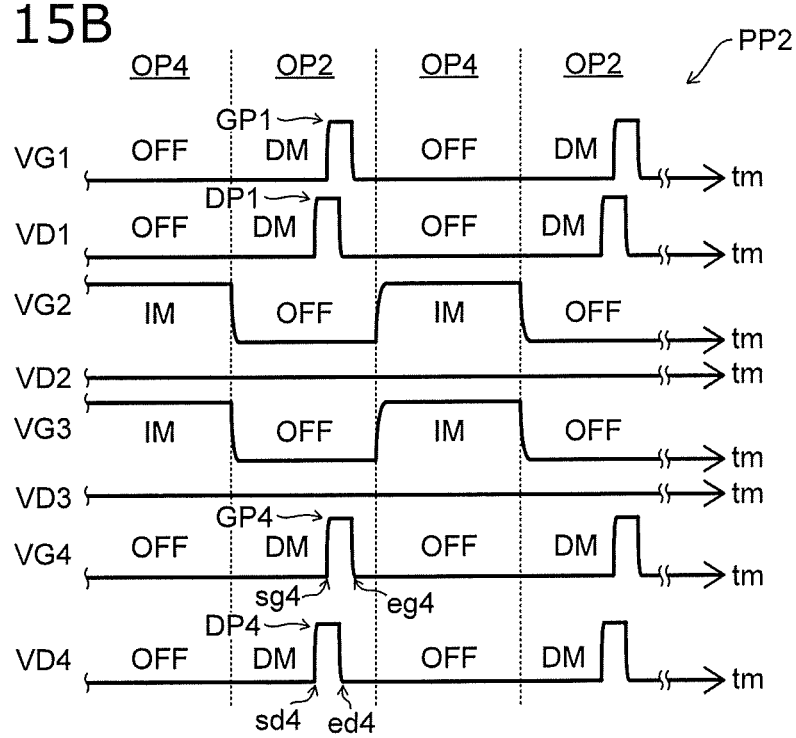
Figure 15C:
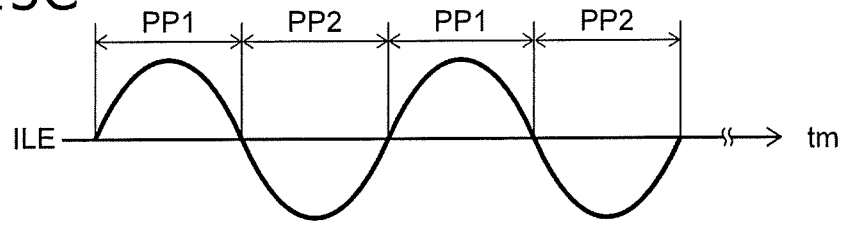

FIG. 15A to FIG. 15C are schematic views illustrating the operation of the control circuit, the semiconductor device, and the electrical circuit device according to the third embodiment.

FIG. 15A corresponds to the first polar operation PP1. FIG. 15B corresponds to the second polar operation PP2. FIG. 15C corresponds to the current flowing in the load LE. In these drawings, the horizontal axis corresponds to the time tm. In FIG. 15A and FIG. 15B, the vertical axis corresponds to the gate voltages (the first to fourth gate voltages VG1 to VG4) of the first to fourth gates G1 to G4 and the gate voltages (the first to fourth other gate voltages VD1 to VD4) of the first to fourth other gates D1 to D4. The vertical axis of FIG. 15C corresponds to a current ILE flowing in the load LE.

The control circuit 70 performs at least the first polar operation PP1 of repeating the first operation OP1 and the third operation OP3, and the second polar operation PP2 of repeating the second operation OP2 and the fourth operation OP4 (referring to FIG. 15C).

The operations relating to the first element Q1 and the second element Q2 are as described in reference to FIG. 10A and FIG. 10B. An example of the operations relating to the third element Q3 and the fourth element Q4 will now be described.

In the third operation OP3 as shown in FIG. 15A, the control circuit 70 supplies a third pulse GP3 to the third gate G3 and supplies a third other pulse DP3 to the third other gate D3.

The third pulse GP3 has a third start time sg3 and a third end time eg3. The third other pulse DP3 has at least one of a third other start time sd3 that is different from the third start time sg3, or a third other end time ed3 that is different from the third end time eg3.

In the second operation OP2 as shown in FIG. 15B, the control circuit 70 supplies a fourth pulse GP4 to the fourth gate G4 and supplies a fourth other pulse DP4 to the fourth other gate D4. The fourth pulse GP4 has a fourth start time sg4 and a fourth end time eg4. The fourth other pulse DP4 has at least one of a fourth other start time sd4 that is different from the fourth start time sg4, or a fourth other end time ed4 that is different from the fourth end time eg4.

Thereby, a high switching speed can be maintained; and the loss can be suppressed more effectively while suppressing the element breakdown.

The third element Q3 and the fourth element Q4 may have configurations similar to those of the first element Q1 or the second element Q2. An example of the configurations of the third element Q3 and the fourth element Q4 will now be described.

Figure 16:
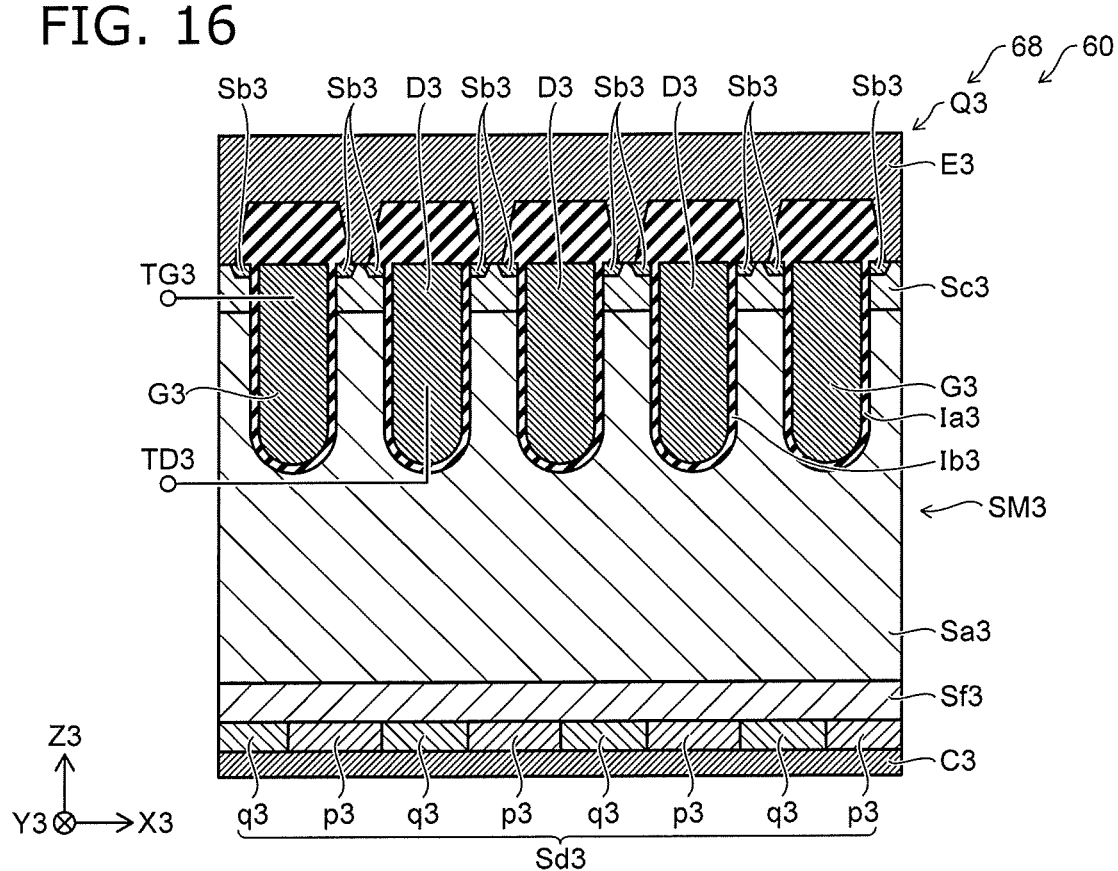
FIG. 16 is a schematic cross-sectional view illustrating the semiconductor device according to the third embodiment.

FIG. 16 is a schematic cross-sectional view illustrating the semiconductor device according to the third embodiment.

FIG. 16 illustrates the third element Q3. As shown in FIG. 16, the third element Q3 includes a semiconductor portion SM3, a first insulating region Ia3, and a second insulating region Ib3 in addition to the third gate G3, the third other gate D3, the third collector C3, and the third emitter E3. The third element Q3 may include a third gate terminal TG3 and a third other gate terminal TD3. The third gate terminal TG3 is electrically connected to the third gate G3. The third other gate terminal TD3 is electrically connected to the third other gate D3.

The semiconductor portion SM3 of the third element Q3 includes, for example, first to fourth semiconductor regions Sa3 to Sd3. In the example, the semiconductor portion SM3 further includes a semiconductor region Sf3.

The first semiconductor region Sa3 of the third element Q3 is of the first conductivity type and is provided between the third collector C3 and the third emitter E3 in a first direction of the third element Q3 which is from the third collector C3 toward the third emitter E3. The first direction is, for example, a Z3-axis direction of the third element Q3. One direction perpendicular to the Z3-axis direction is taken as an X3-axis direction. A direction perpendicular to the Z3-axis direction and the X3-axis direction is taken as a Y3-axis direction.

The second semiconductor region Sb3 of the third element Q3 is electrically connected to the third emitter E3 and is of the first conductivity type.

The third semiconductor region Sc3 of the third element Q3 is of the second conductivity type and is provided between the first semiconductor region Sa3 of the third element Q3 and the second semiconductor region Sb3 of the third element Q3 in the first direction of the third element Q3.

The fourth semiconductor region Sd3 of the third element Q3 is provided between the third collector C3 and the first semiconductor region Sa3 of the third element Q3. The fourth semiconductor region Sd3 of the third element Q3 includes multiple first partial regions p3 of the third element Q3 that are of the first conductivity type, and multiple second partial regions q3 of the third element Q3 that are of the second conductivity type. The multiple first partial regions p3 of the third element Q3 and the multiple second partial regions q3 of the third element Q3 are provided alternately in a direction crossing the first direction of the third element Q3. The direction that crosses the first direction of the third element Q3 is, for example, the X3-axis direction of the third element Q3. The direction that crosses the first direction of the third element Q3 may be any direction along the X3-Y3 plane.

A portion of the first semiconductor region Sa3 of the third element Q3 is between the third gate G3 and the fourth semiconductor region Sd3 of the third element Q3 in the first direction of the third element Q3.

The direction from the third gate G3 toward the third semiconductor region Sc3 of the third element Q3 is aligned with the second direction (e.g., the X3-axis direction) crossing the first direction of the third element Q3.

Another portion of the first semiconductor region Sa3 of the third element Q3 is between the third other gate D3 and the fourth semiconductor region Sd3 of the third element Q3 in the first direction of the third element Q3.

The direction from the third other gate D3 toward the third semiconductor region Sc3 of the third element Q3 is aligned with the second direction (e.g., the X3-axis direction) of the third element Q3.

The first insulating region Ia3 of the third element Q3 is provided between the third gate G3 and the semiconductor portion SM3 of the third element Q3 and between the third gate G3 and the third emitter E3.

The second insulating region Ib3 of the third element Q3 is provided between the third other gate D3 and the semiconductor portion SM3 of the third element Q3 and between the third other gate D3 and the third emitter E3.

The semiconductor region Sf3 of the third element Q3 is provided between the fourth semiconductor region Sd3 of the third element Q3 and the first semiconductor region Sa3 of the third element Q3 in the first direction of the third element Q3. The semiconductor region Sf3 of the third element Q3 is of the first conductivity type.

Figure 17:
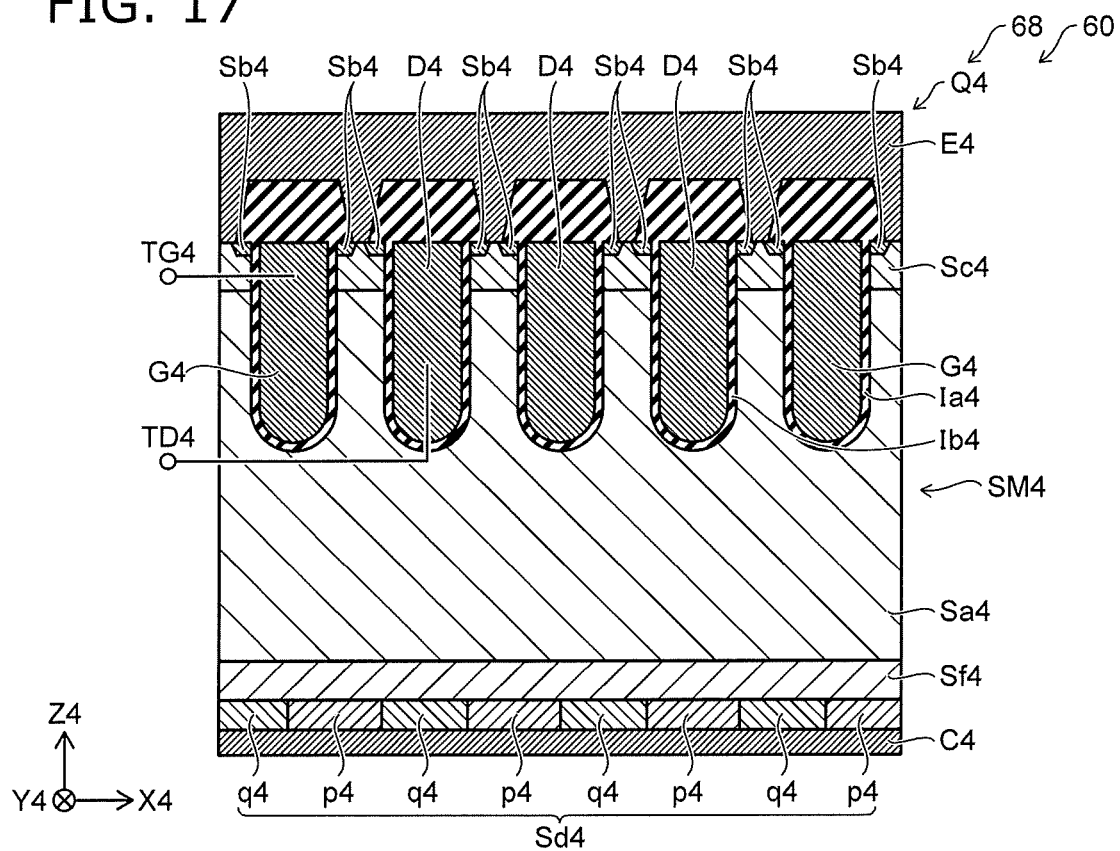
FIG. 17 is a schematic cross-sectional view illustrating the semiconductor device according to the third embodiment.

FIG. 17 is a schematic cross-sectional view illustrating the semiconductor device according to the third embodiment.

FIG. 17 illustrates the fourth element Q4. As shown in FIG. 17, the fourth element Q4 includes a semiconductor portion SM4, a first insulating region Ia4, and a second insulating region Ib4 in addition to the fourth gate G4, the fourth other gate D4, the fourth collector C4, and the fourth emitter E4. The fourth element Q4 may include a fourth gate terminal TG4 and a fourth other gate terminal TD4. The fourth gate terminal TG4 is electrically connected to the fourth gate G4. The fourth other gate terminal TD4 is electrically connected to the fourth other gate D4.

The semiconductor portion SM4 of the fourth element Q4 includes, for example, first to fourth semiconductor regions Sa4 to Sd4. In the example, the semiconductor portion SM4 further includes a semiconductor region Sf4.

The first semiconductor region Sa4 of the fourth element Q4 is of the first conductivity type and is provided between the fourth collector C4 and the fourth emitter E4 in a first direction of the fourth element Q4 which is from the fourth collector C4 toward the fourth emitter E4. The first direction is, for example, a Z4-axis direction of the fourth element Q4. One direction perpendicular to the Z4-axis direction is taken as an X4-axis direction. A direction perpendicular to the Z4-axis direction and the X4-axis direction is taken as a Y4-axis direction.

The second semiconductor region Sb4 of the fourth element Q4 is electrically connected to the fourth emitter E4 and is of the first conductivity type.

The third semiconductor region Sc4 of the fourth element Q4 is of the second conductivity type and is provided between the first semiconductor region Sa4 of the fourth element Q4 and the second semiconductor region Sb4 of the fourth element Q4 in the first direction of the fourth element Q4.

The fourth semiconductor region Sd4 of the fourth element Q4 is provided between the fourth collector C4 and the first semiconductor region Sa4 of the fourth element Q4. The fourth semiconductor region Sd4 of the fourth element Q4 includes multiple first partial regions p4 of the fourth element Q4 that are of the first conductivity type, and multiple second partial regions q4 of the fourth element Q4 that are of the second conductivity type. The multiple first partial regions p4 of the fourth element Q4 and the multiple second partial regions q4 of the fourth element Q4 are provided alternately in a direction crossing the first direction of the fourth element Q4. The direction that crosses the first direction of the fourth element Q4 is, for example, the X4-axis direction of the fourth element Q4. The direction that crosses the first direction of the fourth element Q4 may be any direction along the X4-Y4 plane.

A portion of the first semiconductor region Sa4 of the fourth element Q4 is between the fourth gate G4 and the fourth semiconductor region Sd4 of the fourth element Q4 in the first direction of the fourth element Q4.

The direction from the fourth gate G4 toward the fourth semiconductor region Sd4 of the fourth element Q4 is aligned with the second direction (e.g., the X4-axis direction) crossing the first direction of the fourth element Q4.

Another portion of the first semiconductor region Sa4 of the fourth element Q4 is between the fourth other gate D4 and the fourth semiconductor region Sd4 of the fourth element Q4 in the first direction of the fourth element Q4.

The direction from the fourth other gate D4 toward the third semiconductor region Sc4 of the fourth element Q4 is aligned with the second direction (e.g., the X4-axis direction) of the fourth element Q4.

The first insulating region Ia4 of the fourth element Q4 is provided between the fourth gate G4 and the semiconductor portion SM4 of the fourth element Q4 and between the fourth gate G4 and the fourth emitter E4.

The second insulating region Ib4 of the fourth element Q4 is provided between the fourth other gate D4 and the semiconductor portion SM4 of the fourth element Q4 and between the fourth other gate D4 and the fourth emitter E4.

The semiconductor region Sf4 of the fourth element Q4 is provided between the fourth semiconductor region Sd4 of the fourth element Q4 and the first semiconductor region Sa4 of the fourth element Q4 in the first direction of the fourth element Q4. The semiconductor region Sf4 of the fourth element Q4 is of the first conductivity type.

Figure 18A:
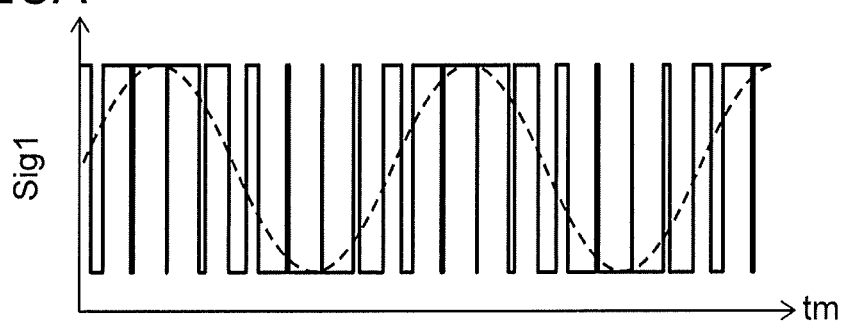
FIG. 18A and FIG. 18B are schematic views illustrating the operation of the control circuit and the electrical circuit device according to the third embodiment.
Figure 18B:
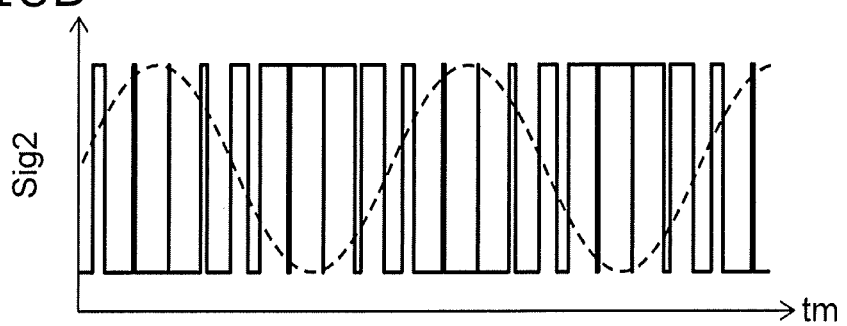

FIG. 18A and FIG. 18B are schematic views illustrating the operation of the control circuit and the electrical circuit device according to the third embodiment.

FIG. 18A illustrates a control signal Sig1 relating to the first element Q1 and the fourth element Q4. FIG. 18B illustrates a control signal Sig2 relating to the second element Q2 and the third element Q3. In these drawings, the horizontal axis is the time tm. The vertical axis corresponds to the intensity of the control signal.

For example, these control signals are generated in the control circuit 70. For example, a triangular wave and a sine wave are input to a comparator. The output of the comparator is used as the control signal Sig1. For example, the reverse ("NOT") of the output of the comparator is used as the control signal Sig2. For example, the length of the period in which the control signal Sig1 is relatively large and the length of the period in which the control signal Sig1 is relatively small are modified. For example, the length of the period in which the control signal Sig2 is relatively large and the length of the period in which the control signal Sig2 is relatively small are modified. Thereby, for example, a control is performed by PWM (Pulse Width Modulation). For example, an inverter control of power equipment, etc., can be performed. For example, the embodiment is applicable to various applications such as an industrial motor, wind power generation, an electric car, etc.

The control signals illustrated in FIG. 18A and FIG. 18B are applicable to the second embodiment.

In the embodiment recited above, one pulse has a first state and a second state. The potential of the pulse in the first state is low. The potential in the second state is higher than the potential in the first state. When the difference between the potential in the first state and the potential in the second state is taken to be 100%, the potential in the first state is 0%; and the potential in the second state is 100%. The start time of the pulse is the time when the potential of the pulse becomes 10% when changing the potential of the pulse from 0% toward 100%. The end time of the pulse is the time when the potential of the pulse becomes 10% when changing the potential of the pulse from 100% toward 0%.

Fourth Embodiment

A fourth embodiment relates to the semiconductor device 68. The semiconductor device 68 includes, for example, the element portion 60 (referring to FIG. 1A). The first element Q1 includes, for example, the first gate G1, the first other gate D1, the first collector C1, the first emitter E1, the semiconductor portion SM1, the first insulating region Ia1, the second insulating region Ib1, the first gate terminal TG1, and the first other gate terminal TD1. The first gate terminal TG1 is electrically connected to the first gate G1. The first other gate terminal TD1 is electrically connected to the first other gate D1. The first other gate terminal TD1 is independent of the first gate terminal TG1. Because the first other gate terminal TD1 is independent of the first gate terminal TG1, independent pulses can be applied to these terminals. Thereby, a control circuit can be provided in which the loss can be suppressed.

For example, the first element Q1 may have the configuration described in reference to FIG. 7. The element portion 60 may further include the second element Q2. The element portion 60 may further include the third element Q3 and the fourth element Q4.

The electrical circuit device (e.g., the electrical circuit devices 110, 120, 121, 130, etc.) according to the embodiment includes, for example, any control circuit 70 described in reference to the first to third embodiments, and the semiconductor device 68 including any element portion 60 recited above. An electrical circuit device can be provided in which the loss can be suppressed.

According to the embodiments, a control circuit, a semiconductor device, and an electrical circuit device can be provided in which the loss can be suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in control circuits such as controllers, switches, etc., and included in semiconductor devices such as element portions, elements, semiconductor portions, semiconductor regions, insulating regions from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all control circuits, semiconductor devices, and electrical circuit devices practicable by an appropriate design modification by one skilled in the art based on the control circuits, the semiconductor devices, and the electrical circuits devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A control circuit connected to an element portion including a first element, the first element being an RC-IGBT,
   the first element including a first gate, a first other gate, a first collector, and a first emitter,
   the control circuit being configured to perform a first operation and a second operation,
   in at least a portion of the first operation, the control circuit being configured to cause a first current to flow from the first collector toward the first emitter,
   in at least a portion of the second operation, the control circuit being configured to cause a second current to flow from the first emitter toward the first collector,
   in the second operation, the control circuit being configured to supply a first pulse to the first gate and supplying a first other pulse to the first other gate,
   the first pulse having a first start time and a first end time,
   the first other pulse having at least one of a first other start time or a first other end time, the first other start time being different from the first start time, the first other end time being different from the first end time.

2. The control circuit according to claim 1, wherein in the first operation, the control circuit electrically connects the first other gate to the first emitter.

3. The control circuit according to claim 1, wherein the first other start time is before the first start time.

4. The control circuit according to claim 1, wherein the first other start time is after the first start time.

5. The control circuit according to claim 1, wherein the first other end time is before the first end time.

6. The control circuit according to claim 1, wherein the first other end time is after the first end time.

7. The control circuit according to claim 1, wherein
   a plurality of at least one of the first gate or the first other gate is provided, and
   a number of the first gates is different from a number of the first other gates.

8. The control circuit according to claim 1, wherein
   the first element includes:
      a semiconductor portion;
      a first insulating region; and
      a second insulating region,
   the semiconductor portion includes:
      a first semiconductor region provided between the first collector and the first emitter in a first direction, the first direction being from the first collector toward the first emitter, the first semiconductor region being of a first conductivity type;
      a second semiconductor region electrically connected to the first emitter, the second semiconductor region being of the first conductivity type;
      a third semiconductor region provided between the first semiconductor region and the second semiconductor region in the first direction, the third semiconductor region being of a second conductivity type; and
      a fourth semiconductor region provided between the first semiconductor region and the first collector, the fourth semiconductor region including a plurality of first partial regions and a plurality of second partial regions, the plurality of first partial regions being of the first conductivity type, the plurality of second partial regions being of the second conductivity type, the plurality of first partial regions and the plurality of second partial regions being provided alternately in a direction crossing the first direction,
   a portion of the first semiconductor region is between the first gate and the fourth semiconductor region in the first direction,
   a direction from the first gate toward the third semiconductor region is aligned with a second direction crossing the first direction,
   an other portion of the first semiconductor region is between the first other gate and the fourth semiconductor region in the first direction,
   a direction from the first other gate toward the third semiconductor region is aligned with the second direction,
   the first insulating region is provided between the first gate and the semiconductor portion and between the first gate and the first emitter, and
   the second insulating region is provided between the first other gate and the semiconductor portion and between the first other gate and the first emitter.

9. The control circuit according to claim 1, wherein
   the element portion further includes a second element, the second element being an RC-IGBT,
   the second element includes a second gate, a second other gate, a second collector, and a second emitter,
   the first emitter is electrically connected to the second collector and a first end portion of a load,
   the control circuit further performs a third operation and a fourth operation,
   in at least a portion of the third operation, the control circuit causes a third current to flow from the second emitter toward the second collector,
   in at least a portion of the fourth operation, the control circuit causes a fourth current to flow from the second collector toward the second emitter, in the third operation, the control circuit supplies a second pulse to the second gate and supplies a second other pulse to the second other gate, the second pulse has a second start time and a second end time, the second other pulse has at least one of a second other start time or a second other end time, the second other start time being different from the second start time, the second other end time being different from the second end time, in the first operation and the second operation, the control circuit sets the second element to an off-state, and in the third operation and the fourth operation, the control circuit sets the first element to an off-state.

10. The control circuit according to claim 9, wherein in the fourth operation, the control circuit electrically connects the second other gate to the second emitter.

11. The control circuit according to claim 9, wherein the first element and the second element are included in a set, and
the element portion includes a plurality of the sets.

12. The control circuit according to claim 9, wherein the element portion further includes a third element and a fourth element, the third element and the fourth element being RC-IGBTs, the third element includes a third gate, a third other gate, a third collector, and a third emitter, the fourth element includes a fourth gate, a fourth other gate, a fourth collector, and a fourth emitter, the first collector is electrically connected to the third collector, the third emitter is electrically connected to the fourth collector and a second end portion of the load, the second emitter is electrically connected to the fourth emitter, in the first operation, the control circuit sets the second element and the third element to an off-state and causes the first current to flow in a first path, the first path being from the first collector toward the first emitter, from the first end portion toward the second end portion, and from the fourth collector toward the fourth emitter, in the second operation, the control circuit sets the second element and the third element to an off-state and causes the second current to flow in a second path, the second path being from the fourth emitter toward the fourth collector, from the second end portion toward the first end portion, and from the first emitter toward the first collector, in the third operation, the control circuit sets the first element and the fourth element to an off-state and causes a third current to flow in a third path, the third path being from the second emitter toward the second collector, from the first end portion toward the second end portion, and from the third emitter toward the third collector, in the fourth operation, the control circuit sets the first element and the fourth element to an off-state and causes a fourth current to flow in a fourth path, the fourth path being from the third collector toward the third emitter, from the second end portion toward the first end portion, and from the second collector toward the second emitter, in the third operation, the control circuit supplies a third pulse to the third gate and supplies a third other pulse to the third other gate, the third pulse has a third start time and a third end time, the third other pulse has at least one of a third other start time or a third other end time, the third other start time being different from the third start time, the third other end time being different from the third end time, in the second operation, the control circuit supplies a fourth pulse to the fourth gate and supplies a fourth other pulse to the fourth other gate, the fourth pulse has a fourth start time and a fourth end time, and the fourth other pulse has at least one of a fourth other start time or a fourth other end time, the fourth other start time being different from the fourth start time, the fourth other end time being different from the fourth end time.

13. The control circuit according to claim 12, wherein
in the first operation, the control circuit electrically connects the fourth other gate to the fourth emitter, and
in the fourth operation, the control circuit electrically connects the second other gate to the second emitter and electrically connects the third other gate to the third emitter.

14. The control circuit according to claim 9, wherein the control circuit performs at least a first polar operation and a second polar operation, the first polar operation repeating the first operation and the third operation, the second polar operation repeating the second operation and the fourth operation.

15. The control circuit according to claim 9, wherein the second element includes:
a semiconductor portion of the second element;
a first insulating region of the second element; and
a second insulating region of the second element,
the semiconductor portion of the second element includes:
a first semiconductor region of the second element provided between the second collector and the second emitter in a first direction of the second element, the first direction of the second element being from the second collector toward the second emitter, the first semiconductor region of the second element being of a first conductivity type;
a second semiconductor region of the second element electrically connected to the second emitter, the second semiconductor region of the second element being of the first conductivity type;
a third semiconductor region of the second element provided between the first semiconductor region of the second element and the second semiconductor region of the second element in the first direction of the second element, the third semiconductor region of the second element being of a second conductivity type; and
a fourth semiconductor region of the second element provided between the second collector and the first semiconductor region of the second element, the fourth semiconductor region of the second element including a plurality of first partial regions of the second element and a plurality of second partial regions of the second element, the plurality of first partial regions of the second element being of the first conductivity type, the plurality of second partial regions of the second element being of the second conductivity type, the plurality of first partial regions of the second element and the plurality of second partial regions of the second element being provided alternately in a direction crossing the first direction of the second element, a portion of the first semiconductor region of the second element is between the second gate and the fourth semiconductor region of the second element in the first direction of the second element, a direction from the second gate toward the third semiconductor region of the second element is aligned with a second direction of the second element crossing the first direction of the second element, an other portion of the first semiconductor region of the second element is between the second other gate and the fourth semiconductor region of the second element in the first direction of the second element, a direction from the second other gate toward the third semiconductor region of the second element is aligned with the second direction of the second element, the first insulating region of the second element is provided between the second gate and the semiconductor portion of the second element and between the second gate and the second emitter, and the second insulating region of the second element is provided between the second other gate and the semiconductor portion of the second element and between the second other gate and the second emitter.

16. The control circuit according to claim 12, wherein the third element includes:
a semiconductor portion of the third element;
a first insulating region of the third element; and
a second insulating region of the third element,
the semiconductor portion of the third element includes:
a first semiconductor region of the third element provided between the third collector and the third emitter in a first direction of the third element, the first direction of the third element being from the third collector toward the third emitter, the first semiconductor region of the third element being of a first conductivity type;
a second semiconductor region of the third element electrically connected to the third emitter, the second semiconductor region of the third element being of the first conductivity type;
a third semiconductor region of the third element provided between the first semiconductor region of the third element and the second semiconductor region of the third element in the first direction of the third element, the third semiconductor region of the third element being of a second conductivity type; and
a fourth semiconductor region of the third element provided between the third collector and the first semiconductor region of the third element, the fourth semiconductor region of the third element including a plurality of first partial regions of the third element and a plurality of second partial regions of the third element, the plurality of first partial regions of the third element being of the first conductivity type, the plurality of second partial regions of the third element being of the second conductivity type, the plurality of first partial regions of the third element and the plurality of second partial regions of the third element being provided alternately in a direction crossing the first direction of the third element,
a portion of the first semiconductor region of the third element is between the third gate and the fourth semiconductor region of the third element in the first direction of the third element, a direction from the third gate toward the third semiconductor region of the third element is aligned with a second direction of the third element crossing the first direction of the third element,
an other portion of the first semiconductor region of the third element is between the third other gate and the fourth semiconductor region of the third element in the first direction of the third element, a direction from the third other gate toward the third semiconductor region of the third element is aligned with the second direction of the third element, the first insulating region of the third element is provided between the third gate and the semiconductor portion of the third element and between the third gate and the third emitter, the second insulating region of the third element is provided between the third other gate and the semiconductor portion of the third element and between the third other gate and the third emitter, the fourth element includes:
a semiconductor portion of the fourth element;
a first insulating region of the fourth element; and
a second insulating region of the fourth element,
the semiconductor portion of the fourth element includes:
a first semiconductor region of the fourth element provided between the fourth collector and the fourth emitter in a first direction of the fourth element, the first direction of the fourth element being from the fourth collector toward the fourth emitter, the first semiconductor region of the fourth element being of a first conductivity type;
a second semiconductor region of the fourth element electrically connected to the fourth emitter, the second semiconductor region of the fourth element being of the first conductivity type;
a third semiconductor region of the fourth element provided between the first semiconductor region of the fourth element and the second semiconductor region of the fourth element in the first direction of the fourth element, the third semiconductor region of the fourth element being of a second conductivity type; and
a fourth semiconductor region of the fourth element provided between the fourth collector and the first semiconductor region of the fourth element, the fourth semiconductor region of the fourth element including a plurality of first partial regions of the fourth element and a plurality of second partial regions of the fourth element, the plurality of first partial regions of the fourth element being of the first conductivity type, the plurality of second partial regions of the fourth element being of the second conductivity type, the plurality of first partial regions of the fourth element and the plurality of second partial regions of the fourth element being provided alternately in a direction crossing the first direction of the fourth element, a portion of the first semiconductor region of the fourth element is between the fourth gate and the fourth semiconductor region of the fourth element in the first direction of the fourth element, a direction from the fourth gate toward the third semiconductor region of the fourth element is aligned with a second direction of the fourth element crossing the first direction of the fourth element, an other portion of the first semiconductor region of the fourth element is between the fourth other gate and the fourth semiconductor region of the fourth element in the first direction of the fourth element, a direction from the fourth other gate toward the third semiconductor region of the fourth element is aligned with the second direction of the fourth element, the first insulating region of the fourth element is provided between the fourth gate and the semiconductor portion of the fourth element and between the fourth gate and the fourth emitter, and the second insulating region of the fourth element is provided between the fourth other gate and the semiconductor portion of the fourth element and between the fourth other gate and the fourth emitter.

17. An electrical circuit device, comprising:
the control circuit according to claim 1; and
a semiconductor device including the element portion.

18. The electrical circuit device according to claim 17, further comprising a power supply being configured to supply electrical power to the element portion.

19. A semiconductor device, comprising an element portion including a first element,
the first element including
a first gate,
a first other gate,
a first collector,
a first emitter,
a semiconductor portion,
a first insulating region,
a second insulating region,
a first gate terminal electrically connected to the first gate, and
a first other gate terminal electrically connected to the first other gate and independent of the first gate terminal,
the semiconductor portion including
a first semiconductor region provided between the first collector and the first emitter in a first direction, the first direction being from the first collector toward the first emitter, the first semiconductor region being of a first conductivity type,
a second semiconductor region provided between the first semiconductor region and the first emitter and electrically connected to the first emitter, the second semiconductor region being of the first conductivity type,
a third semiconductor region provided between the first semiconductor region and the second semiconductor region in the first direction, the third semiconductor region being of a second conductivity type, and
a fourth semiconductor region provided between the first semiconductor region and the first collector, the fourth semiconductor region including a plurality of first partial regions and a plurality of second partial regions, the plurality of first partial regions being of the first conductivity type, the plurality of second partial regions being of the second conductivity type, the plurality of first partial regions and the plurality of second partial regions being provided alternately in a direction crossing the first direction,
a direction from the first gate toward a portion of the first semiconductor region and a direction from the first gate toward the third semiconductor region being aligned with a second direction crossing the first direction,
a direction from the first other gate toward a portion of the first semiconductor region and a direction from the first other gate toward the third semiconductor region being aligned with the second direction,
the first insulating region being provided between the first gate and the semiconductor portion and between the first gate and the first emitter,
the second insulating region being provided between the first other gate and the semiconductor portion and between the first other gate and the first emitter.

* * * * *